(12) United States Patent
Won et al.

(10) Patent No.: US 11,398,580 B2
(45) Date of Patent: Jul. 26, 2022

(54) LIGHT EMITTING DIODE AND LIGHT EMITTING DEVICE INCLUDING THE SAME

(71) Applicant: LG DISPLAY CO., LTD., Seoul (KR)

(72) Inventors: Jeong-Eun Won, Paju-si (KR); So-Mang Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 41 days.

(21) Appl. No.: 17/012,582

(22) Filed: Sep. 4, 2020

(65) Prior Publication Data
US 2021/0066544 A1 Mar. 4, 2021

(30) Foreign Application Priority Data

Sep. 4, 2019 (KR) .......... 10-2019-0109453

(51) Int. Cl.
*H01L 33/14* (2010.01)
*H01L 33/26* (2010.01)
*H01L 33/06* (2010.01)

(52) U.S. Cl.
CPC .............. *H01L 33/14* (2013.01); *H01L 33/06* (2013.01); *H01L 33/26* (2013.01)

(58) Field of Classification Search
CPC ......... H01L 33/14; H01L 33/06; H01L 33/26; H01L 51/5056; H01L 51/5072; H01L 51/502; H01L 2251/5369; H01L 2251/303
See application file for complete search history.

(56) References Cited

U.S. PATENT DOCUMENTS

2020/0411719 A1* 12/2020 Kimoto .................. H05B 33/14

OTHER PUBLICATIONS

Amelie Heuer-Jungemann, The Role of Ligands in the Chemical Synthesis and Applications of Inorganic Nanoparticles, Chemical Reviews 2019 119 (8), 4819-4880 (Year: 2019).*

* cited by examiner

*Primary Examiner* — Mark W Tornow
(74) *Attorney, Agent, or Firm* — Morgan, Lewis & Bockius LLP

(57) ABSTRACT

The present disclosure relates to a light emitting diode in which a charge transfer layer, which disposed between two electrodes, including an inorganic material in which an amphiphilic ligand is connected to a surface of an inorganic nano particle and to a light emitting device having the diode. The amphiphilic ligand minimizes defects on the surface of the inorganic nano particle, thus charge transfer materials can be stably. Since charge transfer layers and an emitting material layer can be prepared by using an orthogonal solvent, interface morphology between the emissive layers can be improved.

20 Claims, 14 Drawing Sheets

LIGHT EMITTING DIODE AND LIGHT EMITTING DEVICE INCLUDING THE SAME

CROSS REFERENCE TO RELATED APPLICATION

This application claims the benefit under 35 U.S.C. § 119(a) of Korean Patent Application No. 10-2019-0109453, filed in the Republic of Korea on Sep. 4, 2019, which is incorporated herein by reference in its entirety.

BACKGROUND

Technical Field

The present disclosure relates to a light emitting diode, and more specifically, to a light emitting diode that enables an emissive layer to form stably and improves its luminous efficiency and luminous lifetime and a light emitting device having the diode.

Discussion of the Related Art

As electronic and information technologies progress rapidly, a field of displays for processing and displaying a large quantity of information has been developed rapidly. Accordingly, various flat panel display devices have been widely used. Among the flat panel display devices, an organic light emitting diode (OLED) has come into spotlight. Since the OLED can be formed even on a flexible transparent substrate and has relatively lower power consumption, the OLED display device has attracted a lot of attention as a next-generation display device replacing LCD. However, in case of increasing current densities or raising driving voltages in the OLED for improving luminance in OLED display device, the luminous lifetime of the OLED become shorter owing to thermal degradation and deteriorations of organic materials in the OLED.

Recently, a display device using inorganic luminescence particles such as quantum dot (QD) or quantum rod (QR) has been developed. QD or QR is an inorganic luminescence particle that emits light as unstable stated excitons shift from its conduction band to its valance band. QD or QR has large extinction coefficient, high quantum yield among inorganic particles and generates strong fluorescence. Besides, since QD or QR has different luminescence wavelengths as its sizes, it is possible to obtain light within the whole visible light spectra so as to implement various colors by adjusting sizes of QD or QR.

However, a quantum-dot light emitting diode (QLED) in which inorganic nano particle such as QD is introduced has shown very low luminous efficiency compared to the OLED. In addition, when inorganic nano particles are used as charge transfer material in an electron transfer layer in the OLED and QLED, the inorganic nano particles aggregates each other and defects occurs on a surface thereof, and thus charger transfer is delayed.

In addition, solution process in which a plurality of thin layers of LED is formed using solvent has attracted a lot of attention. When the lower layer is melted in the solvent used to form the upper layer among the emissive layers of the LED, materials for each layer may be mixed at the interface between the lower and upper layers and interface properties may be deteriorated. Accordingly, it is not possible to use a compatible solvent capable of dispersing and dissolving all the luminescence materials and charge transfer materials constituting the adjacent emissive layers in the LED using the solution process. In other words, when preparing the LED using the solution process, an orthogonal solvent that has little effect or no effect on materials of the emissive layers should be used. However, since the kind of the solvent that can be used for each emissive layer is limited, it is necessary to develop material that can be dispersed and dissolved in the defined solvent and that has an appropriate energy level.

SUMMARY

Accordingly, embodiments of the present disclosure are directed to a light emitting diode and a light emitting device having the diode that substantially obviate one or more of the problems due to the limitations and disadvantages of the related art.

An object of the present disclosure is to provide a light emitting diode that has a superior interface morphology by minimizing defects of charge transfer material and forming stably charge transfer layers and a light emitting device including the same.

Another object of the present disclosure is to provide a light emitting diode that implement efficiently solution process to which an orthogonal solvent is applied and a light emitting device including the same.

Another object of the present disclosure is to provide a light emitting diode that improves its luminous efficiency and luminous lifetime and a light emitting device including the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a light emitting diode comprises a first electrode; a second electrode facing the first electrode; an emitting material layer disposed between the first and second electrodes; and an electron transfer layer disposed between the emitting material layer and one of the first and second electrodes acting as a cathode, wherein the electron transfer layer comprise an inorganic material in which an amphiphilic ligand is connected to a surface of an inorganic nano particle.

In another aspect, a light emitting diode comprises a first electrode; a second electrode facing the first electrode; an emitting material layer disposed between the first and second electrodes; a first charge transfer layer disposed between the first electrode and the emitting material layer; and a second charge transfer layer disposed between the emitting material layer and the second electrode, wherein at least one of the first and second charge transfer layers comprise an inorganic material in which an amphiphilic ligand is connected to a surface of an inorganic nano particle.

In still another aspect, a light emitting device comprises a substrate and the light emitting diode over the substrate, as described above.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure, are incorporated in and constitute a part of this application, illustrate embodiments of the disclosure and together with the description serve to explain principles of the disclosure.

DETAILED DESCRIPTION

Reference will now be made in detail to aspects of the disclosure, examples of which are illustrated in the accompanying drawing.

[Light Emitting Device]

Figure 1:
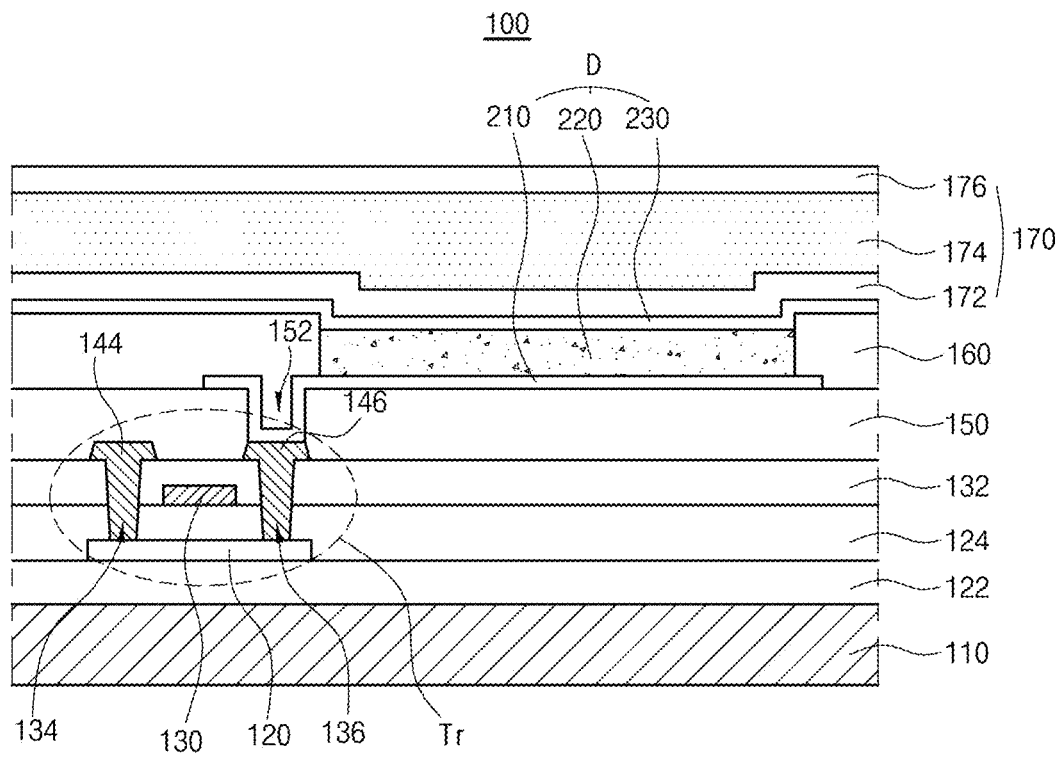
FIG. 1 is a schematic cross-sectional view illustrating a light emitting display device in accordance with the present disclosure.

The present disclosure relates to a light emitting diode (LED) in which an inorganic material having an amphiphilic ligand is applied into at least one charge transfer layer and a light emitting device having the LED. The LED may be applied to a light emitting device such as a light emitting display device and a light emitting illumination device. FIG. 1 is a schematic cross-sectional view illustrating a light emitting display device in accordance with the present disclosure.

As illustrated in FIG. 1, a light emitting display device 100 includes a substrate 110, a thin film transistor Tr over the substrate 110 and a light emitting diode (LED) D connected to the thin film transistor Tr.

The substrate 110 may include, but is not limited to, glass, thin flexible material and/or polymer plastics. For example, the flexible material may be selected from the group, but is not limited to, polyimide (PI), polyethersulfone (PES), polyethylenenaphthalate (PEN), polyethylene terephthalate (PET), polycarbonate (PC) and combination thereof. The substrate 110, over which the thin film transistor Tr and the LED D are arranged, form an array substrate.

A buffer layer 122 may be disposed over the substrate 110, and the thin film transistor Tr is disposed over the buffer layer 122. The buffer layer 122 may be omitted.

A semiconductor layer 120 is disposed over the buffer layer 122. In one exemplary aspect, the semiconductor layer 120 may include, but is not limited to, oxide semiconductor materials. In this case, a light-shied pattern may be disposed under the semiconductor layer 120, and the light-shield pattern can prevent light from being incident toward the semiconductor layer 120, and thereby preventing the semiconductor layer 120 from being deteriorated by the light. Alternatively, the semiconductor layer 120 may include polycrystalline silicon. In this case, opposite edges of the semiconductor layer 120 may be doped with impurities.

A gate insulating layer 124 made of an insulating material is disposed on the semiconductor layer 120. The gate insulating layer 124 may include, but is not limited to, an inorganic insulating material such as silicon oxide (SiOx) or silicon nitride (SiNx).

A gate electrode 130 made of a conductive material such as a metal is disposed over the gate insulating layer 124 so as to correspond to a center of the semiconductor layer 120. While the gate insulating layer 124 is disposed over a whole area of the substrate 110 in FIG. 1, the gate insulating layer 124 may be patterned identically as the gate electrode 130.

An interlayer insulating layer 132 made of an insulating material is disposed on the gate electrode 130 with covering over an entire surface of the substrate 110. The interlayer insulating layer 132 may include, but is not limited to, an inorganic insulating material such as silicon oxide (SiOx) or silicon nitride (SiNx), or an organic insulating material such as benzocyclobutene or photo-acryl.

The interlayer insulating layer 132 has first and second semiconductor layer contact holes 134 and 136 that expose both sides of the semiconductor layer 120. The first and second semiconductor layer contact holes 134 and 136 are disposed over both sides of the gate electrode 130 with spacing apart from the gate electrode 130. The first and second semiconductor layer contact holes 134 and 136 are formed within the gate insulating layer 124 in FIG. 1. Alternatively, the first and second semiconductor layer contact holes 134 and 136 are formed only within the interlayer insulating layer 132 when the gate insulating layer 124 is patterned identically as the gate electrode 130.

A source electrode 144 and a drain electrode 146, each of which includes a conductive material such as a metal, are disposed on the interlayer insulating layer 132. The source electrode 144 and the drain electrode 146 are spaced apart from each other with respect to the gate electrode 130, and contact both sides of the semiconductor layer 120 through the first and second semiconductor layer contact holes 134 and 136, respectively.

The semiconductor layer 120, the gate electrode 130, the source electrode 144 and the drain electrode 146 constitute the thin film transistor Tr, which acts as a driving element. The thin film transistor Tr in FIG. 1 has a coplanar structure in which the gate electrode 130, the source electrode 144 and the drain electrode 146 are disposed over the semiconductor layer 120. Alternatively, the thin film transistor Tr may have an inverted staggered structure in which a gate electrode is disposed under a semiconductor layer and source and drain electrodes are disposed over the semiconductor layer. In this case, the semiconductor layer may include, but are not limited to, amorphous silicon.

Although not shown in FIG. 1, a gate line and a data line, which cross each other to define a pixel region, and a switching element, which is connected to the gate line and the data line, may be further formed in the pixel region. The switching element is connected to the thin film transistor Tr, which is a driving element. In addition, a power line is spaced apart in parallel from the gate line or the data line, and the thin film transistor Tr may further includes a storage capacitor configured to constantly keep a voltage of the gate electrode for one frame.

Moreover, the light emitting display device 100 may include a color filter that comprises dyes or pigments for transmitting specific wavelength light of light emitted from the LED D. For example, the color filter can transmit light of specific wavelength such as red (R), green (G), blue (B) and/or white (W). Each of red, green, and blue color filter may be formed separately in each pixel region. In this case, the light emitting display device 100 can implement full-color through the color filter.

For example, when the light emitting display device 100 is a bottom-emission type, the color filter may be disposed on the interlayer insulating layer 132 with corresponding to the LED D. Alternatively, when the light emitting display device 100 is a top-emission type, the color filter may be disposed over the LED D, that is, a second electrode 230.

A passivation layer 150 is disposed on the source and drain electrodes 144 and 146 over the whole substrate 110. The passivation layer 150 has a flat top surface and a drain contact hole 152 that exposes the drain electrode 146 of the thin film transistor Tr. While the drain contact hole 152 is disposed on the second semiconductor layer contact hole 136, it may be spaced apart from the second semiconductor layer contact hole 136.

The LED D includes a first electrode 210 that is disposed on the passivation layer 150 and connected to the drain electrode 146 of the thin film transistor Tr. The LED D further includes an emissive layer 220 and a second electrode 230 each of which is disposed sequentially on the first electrode 210.

The first electrode 210 is disposed in each pixel region. The first electrode 210 may be an anode and include a conductive material having relatively high work function value. For example, the first electrode 210 may include, but is not limited to, a doped or undoped metal oxide such as indium-tin-oxide (ITO), indium-zinc-oxide (IZO), indium-tin-zinc oxide (ITZO), indium-copper-oxide (ICO), tin oxide ($SnO_2$), indium oxide ($In_2O_3$), cadmium:zinc oxide (Cd: ZnO), fluorine:tin oxide ($F:SnO_2$), indium:tin oxide (In: $SnO_2$), gallium:tin oxide ($Ga:SnO_2$) or aluminum:zinc oxide (Al:ZnO; AZO). Optionally, the first electrode 210 may include a metal or nonmetal material such as nickel (Ni), platinum (Pt), gold (Au), silver (Ag), iridium (Ir) or a carbon nanotube (CNT), other than the above-described metal oxide.

In one exemplary aspect, when the light emitting display device 100 is a top-emission type, a reflective electrode or a reflective layer (not shown) may be disposed under the first electrode 210. For example, the reflective electrode or the reflective layer (not shown) may comprise, but are not limited to, aluminum-palladium-copper (APC) alloy.

In addition, a bank layer 160 is disposed on the passivation layer 150 in order to cover edges of the first electrode 210. The bank layer 160 exposes a center of the first electrode 210.

An emissive layer 220 is disposed on the first electrode 210. In one exemplary aspect, the emissive layer 220 may have a mono-layered structure of an emitting material layer (EML). Alternatively, the emissive layer 220 may have a multiple-layered structure of an EML 240 or 440, a first charge transfer layer 250 or 450, a second charge transfer layer 270 or 470, and optionally an exciton charge layer 260, 280, 460 and/or 480 (see, FIG. 2 or 5). Alternatively, the LED D may have one emitting unit or have multiple emitting units to form a tandem structure.

The second electrode 230 is disposed over the substrate 110 above which the emissive layer 220 is disposed. The second electrode 230 may be disposed over a whole display area, may include a conductive material having a relatively low work function value compared to the first electrode 210, and may be a cathode. For example, the second electrode 230 may include, but is not limited to, Ca, Ba, Ca/Al, LiF/Ca, LiF/Al, $BaF_2$/Al, CsF/Al, $CaCO_3$/Al, $BaF_2$/Ca/Al, Al, Mg, Au:Mg or Ag:Mg.

In addition, an encapsulation film 170 may be disposed over the second electrode 220 in order to prevent outer moisture from penetrating into the LED D. The encapsulation film 170 may have, but are not limited to, a laminated structure of a first inorganic insulating film 172, an organic insulating film 174 and a second inorganic insulating film 176.

Moreover, a polarizer may be attached to the encapsulation film 170 in order to decrease external light reflection. For example, the polarizer may be a circular polarizer. In addition, a cover window may be attached to the encapsulation film 170 or the polarizer. In this case, the substrate 110 and the cover window may have a flexible property, thus the light emitting display device 100 may be a flexible display device.

As described below, at least one charge transfer layer of the LED D comprises an inorganic material in which an amphiphilic ligand is bound to a surface of an inorganic nano particle. By introducing the amphiphilic ligand into the nano particle, surface defects on the nano particle and the aggregations among the nano particles can be minimized. Accordingly, it is possible to implement the LED D and the light emitting display device 100 that improve their luminous efficiency and luminous lifetime by a solution process applying orthogonal solvents.

[Light Emitting Diode]

Figure 2:
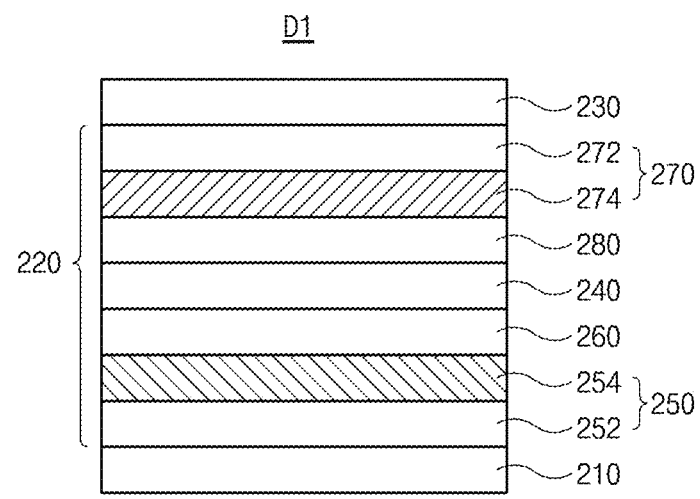
FIG. 2 is a schematic cross-sectional view illustrating a light emitting diode having a normal structure in accordance with an exemplary aspect of the present disclosure.

FIG. 2 is a cross-sectional view illustrating a light emitting diode in accordance with one exemplary aspect of the present disclosure. As illustrated in FIG. 2, the light emitting diode (LED) D1 comprises a first electrode 210, a second electrode 230 facing the first electrode 210 and an emissive layer 220 disposed between the first and second electrodes 210 and 230. The emissive layer 220 comprises an emitting material layer (EML) 240 disposed between the first and second electrodes 210 and 230. Also, the emissive layer 220 includes a first charge transfer layer (CTL1) 250 disposed between the first electrode and the EML 240 and a second charge transfer layer (CTL2) 270 disposed between the EML 240 and the second electrode 230. At least one of the CTL 1 250 and the CTL2 270 may comprise an inorganic material 300 (see, FIG. 4).

Alternatively, the emissive layer 220 may further comprise a first exciton blocking layer, i.e. an electron blocking layer (EBL) 260 disposed between the CTL1 250 and the EML 240 and/or a second exciton blocking layer, i.e. a hole blocking layer (HBL) 280 disposed between the EML 240 and the CTL2 270.

In this aspect, the first electrode 210 may be an anode such as a hole injection electrode. The first electrode 210 may be located over a substrate 110 (see, FIG. 1) that may be a glass or a polymer. As an example, the first electrode 210 may include, but is not limited to, a doped or undoped metal oxide such as ITO, IZO, ITZO, ICO, $SnO_2$, $In_2O_3$, Cd:ZnO, F:$SnO_2$, In:$SnO_2$, Ga:$SnO_2$ and AZO. Optionally, the first electrode 210 may include a metal or nonmetal material such as Ni, Pt, Au, Ag, Ir and CNT, other than the above-described metal oxide.

The second electrode 230 may be a cathode such as an electron injection electrode. As an example, the second electrode 230 may include, but are not limited to, Ca, Ba, Ca/Al, LiF/Ca, LiF/Al, $BaF_2$/Al, CsF/Al, $CaCO_3$/Al, $BaF_2$/Ca/Al, Al, Mg, Au:Mg or Ag:Mg. As an example, each of the first electrode 210 and the second electrode 230 may have a thickness of, but are not limited to, about 30 to about 300 nm.

In one exemplary aspect, when the LED D is a bottom emission-type LED, the first electrode 210 may include, but is not limited to, a transparent conductive metal oxide such as ITO, IZO, ITZO or AZO, and the second electrode 230 may include, but is not limited to, Ca, Ba, Ca/Al, LiF/Ca, LiF/Al, $BaF_2$/Al, Al, Mg, or an Ag:Mg alloy.

The EML 240 may include inorganic luminescence particles or organic luminescence material. As an example, the EML 240 may include the inorganic luminescence particles such as quantum dots (QDs) or quantum rods (QRs). QDs or QRs are inorganic luminescence particles each of which emits light as unstable charge excitons shifts from the conduction band energy level to the valance band (VB) energy level. These inorganic luminescence particles have very large extinction coefficient, high quantum yield among inorganic particles and generates strong fluorescence. In addition, these inorganic luminescence particles emits at different luminescence wavelengths as its sizes, it is possible to emit lights within the whole visible light spectra so as to implement various colors by adjusting sizes of these inorganic luminescence particles. When these inorganic luminescence particles such as QDs and/or QRs are used as a luminescence material in the EML 240, it is possible to enhance color purity in individual pixel region and to realize White (W) light consisting of red (R), green (G) and blue (B) light having high color purity.

In one exemplary aspect, QDs or QRs may have a single-layered structure. In another exemplary aspect, QDs or QRs may have a multiple-layered heterologous structure, i.e. core/shell structure. In this case, each of the core and the shell may have a single layer or multiple layers, respectively. The reactivity of precursors forming the core and/or shell, injection rates of the precursors into a reaction vessel, reaction temperature and kinds of ligands bonded to an outer surface of those inorganic luminescence particles such as QDs or QRs may have affects upon the growth degrees, crystal structures of those inorganic luminescence particles. As a result, it is possible to emit lights of various luminescent wavelength ranges, as the energy level bandgap of those inorganic luminescence particles are adjusted.

In one exemplary aspect, inorganic luminescence particles (e.g. QDs and/or QRs) may have a type I core/shell structure where an energy level bandgap of the core is within an energy level bandgap of the shell. In case of using the type I core/shell structure, electrons and holes are transferred to the core and recombined in the core. Since the core emits light from exciton energies, it is possible to adjust luminance wavelengths by adjusting sizes of the core.

In another exemplary aspect, the inorganic luminescence particles (e.g. QDs and/or QRs) may have type II core/shell structure where the energy level bandgap of the core and the shell are staggered and electrons and holes are transferred to opposite directions among the core and the shell. In case of using the type II core/shell structure, it is possible to adjust luminescence wavelengths as the thickness and the energy bandgap locations of the shell.

In still another exemplary aspect, the inorganic luminescence particles (e.g. QDs and/or QRs) may have reverse type I core/shell structure where the energy level bandgap of the core is wider than the energy level bandgap of the shell. In case of using the reverse type I core/shell structure, it is possible to adjust luminescence wavelengths as thickness of the shell.

As an example, when the inorganic luminescence particle (e.g. QDs and/or QRs) has a type-I core/shell structure, the core is a region where luminescence substantially occurs, and a luminescence wavelength of the inorganic luminescence particle is determined as the sizes of the core. To achieve a quantum confinement effect, the core necessarily has a smaller size than the exciton Bohr radius according to material of the inorganic luminescence particle, and an optical bandgap at a corresponding size.

The shell of the inorganic luminescence particles (e.g. QDs and/or QRs) promotes the quantum confinement effect of the core, and determines the stability of the particles. Atoms exposed on a surface of colloidal inorganic luminescence particles (e.g. QDs and/or QRs) having only a single structure have lone pair electrons which do not participate in a chemical bond, unlike the internal atoms. Since energy levels of these surface atoms are between the conduction band edge and the valance band edge of the inorganic luminescence particles (e.g. QDs and/or QRs), the charges may be trapped on the surface of the inorganic luminescence particles (e.g. QDs and/or QRs), and thereby resulting in surface defects. Due to a non-radiative recombination process of excitons caused by the surface defects, the luminous efficiency of the inorganic luminescence particles may be degraded, and the trapped charges may react with external oxygen and compounds, leading to a change in the chemical composition of the inorganic luminescence particles, or to a permanent loss of the electrical/optical properties of the inorganic luminescence particles.

To effectively form the shell on the surface of the core, a lattice constant of the material in the shell needs to be similar to that of the material in the core. As the surface of the core is enclosed by the shell, the oxidation of the core may be prevented, the chemical stability of the inorganic luminescence particles (e.g. QDs and/or QRs) may be enhanced, and the photo-degradation of the core by an external factor such as water or oxygen may be prevented. In addition, the loss of excitons caused by the surface trap on the surface of the core may be minimized, and the energy loss caused by molecular vibration may be prevented, thereby enhancing the quantum efficiency.

In one exemplary aspect, each of the core and the shell may include, but is not limited to, a semiconductor nanocrystal and/or metal oxide nanocrystal having quantum confinement effect. For example, the semiconductor nanocrystal of the core and the shell may be selected from the group, but is not limited to, consisting of Group II-VI compound semiconductor nanocrystal, Group III-V compound semiconductor nanocrystal, Group IV-VI compound semiconductor nanocrystal, Group compound semiconductor nanocrystal and combination thereof.

Particularly, Group II-VI compound semiconductor nanocrystal of the core and/or the shell may be selected from the group, but is not limited to, consisting of MgS, MgSe, MgTe, CaS, CaSe, CaTe, SrS, SrSe, SrTe, BaS, BaSe, BaTe, ZnS, ZnSe, ZnTe, ZnSeS, ZnTeSe, ZnO, CdS, CdSe, CdTe, CdSeS, CdZnS, CdSeTe, CdO, HgS, HgSe, HgTe, CdZnTe, HgCdTe, HgZnSe, HgZnTe, CdS/ZnS, CdS/ZnSe, CdSe/ZnS, CdSe/ZnSe, ZnSe/ZnS, ZnS/CdSZnS, CdS/CdZnS/ZnS, ZnS/ZnSe/CdSe and combination thereof. Group III-V compound semiconductor nanocrystal of the core and/or shell may be selected from the group, but is not limited to, consisting of AlN, AlP, AlAs, AlSb, GaN, GaP, GaAs, GaSb, InN, InP, InAs, InSb, AlGaAs, InGaAs, InGaP, AlInAs, AlInSb, GaAsN, GaAsP, GaAsSb, AlGaN, AlGaP, InGaN, InAsSb, InGaSb, AlGaInP, AlGaAsP, InGaAsP, InGaAsSb, InAsSbP, AlInAsP, AlGaAsN, InGaAsN, InAlAsN, GaAsSbN, GaInNAsSb and combination thereof.

Group IV-VI compound semiconductor nanocrystal of the core and/or shell may be selected from the group, but is not limited to, consisting of $TiO_2$, $SnO_2$, SnS, $SnS_2$, SnTe, PbO, $PbO_2$, PbS, PbSe, PbTe, PbSnTe and combination thereof. Also, Group compound semiconductor nanocrystal of the core and/or shell may be selected from the group, but is not limited to, $AgGaS_2$, $AgGaSe_2$, $AgGaTe_2$, $AgInS_2$, $CuInS_2$, $CuInSe_2$, $Cu_2SnS_3$, $CuGaS_2$, $CuGaSe_2$ and combination thereof. Alternatively, each of the core and the shell may independently include multiple layers each of which has different Groups compound semiconductor nanocrystal, e.g., Group II-VI compound semiconductor nanocrystal and Group III-V compound semiconductor nanocrystal such as InP/ZnS, InP/ZnSe, GaP/ZnS, and the likes, respectively.

In another aspect, the metal oxide nanocrystal of the core and/or shell may include, but are not limited to, Group II or Group III metal oxide nanocrystal. As an example, the metal oxide nanocrystal of the core and/or the shell may be selected from the group, but is not limited to, MgO, CaO, SrO, BaO, $Al_2O_3$ and combination thereof.

The semiconductor nanocrystal of the core and/or the shell may be doped with a rare earth element such as Eu, Er, Tb, Tm, Dy or an arbitrary combination thereof or may be doped with a metal element such as Mn, Cu, Ag, Al or an arbitrary combination thereof.

As an example, the core in QDs or QRs may include, but is not limited to, ZnSe, ZnTe, CdSe, CdTe, InP, ZnCdS, CuxIn1-xS, CuxIn1-xSe, AgxIn1-xS and combination thereof. The shell in QDs or QRs may include, but is not limited to, ZnS, GaP, CdS, ZnSe, CdS/ZnS, ZnSe/ZnS, ZnS/ZnSe/CdSe, GaP/ZnS, CdS/CdZnS/ZnS, ZnS/CdSZnS, CdXZn1-xS and combination thereof.

In another exemplary aspect, the inorganic luminescence particle may include, but are not limited to, alloy QD or alloy QR such as homogenous alloy QD or QR or gradient alloy QD or QR, e.g. CdSxSe1-x, CdSexTe1-x, CdXZn1-xS, ZnxCd1-xSe, CuxIn1-xS, CuxIn1-xSe, AgxIn1-xS.

In another exemplary aspect, the inorganic luminescence particle may be QDs or QRs having a Perovskite structure. The inorganic luminescence particle such as The QDs or QRs of the Perovskite structure comprises a core as a luminescent component and optionally a shell. As an example, the core of the inorganic luminescence particle having the Perovskite structure may have the following structure of Chemical Formula 1:

$$[ABX_3] \qquad \text{[Chemical Formula 1]}$$

In Chemical Formula 1, A is an organic ammonium or alkali metal; B is a metal selected from the group consisting of divalent transition metal, rare earth metal, alkaline earth metal, Pb, Sn, Ge, Ga, In, Al, Sb, Bi, Po and combination thereof; and X is halogen selected from the group consisting of Cl, Br, I and combination thereof.

For example, when the A is an organic ammonium, the inorganic luminescence particle constitutes an inorganic-organic hybrid Perovskite structure. The organic ammonium may comprise, but is not limited to, amidinium-based organic ion, $(CH_3NH_3)_n$, $((C_xH_{2x+1})_nNH_3)_2(CH_3NH_3)_n$, $(CnH_{2n+1}NH_3)_2$, $(CF_3NH_3)$, $(CF_3NH_3)_n$, $((C_xF_{2x+1})_nNH_3)_2$ $(CF_3NH_3)_n$, $((C_xF_{2x+1})_nNH_3)_2$ and/or $(C_nF_{2n+1}NH_3)_2$)(each of n and x is independently an integer equal to or more than 1, respectively). More specifically, the organic ammonium may be methyl ammonium or ethyl ammonium.

In addition, the alkali metal of the A may comprise, but is not limited to, Na, K, Rb, Cs and/or Fr. In this case, the inorganic luminescence particle constitutes an inorganic metal Perovskite structure.

For example, when the core of the inorganic luminescence particle having Perovskite structure has the inorganic-organic hybrid Perovskite structure, the inorganic-organic hybrid Perovskite structure has a layered structure in which an inorganic plane in which a metal cation is located is sandwiched between organic planes in which the organic cations are located. In this case, since the difference between the dielectric constant of the organic and inorganic materials is large, exciton is constrained in the inorganic plane constituting the inorganic-organic hybrid Perovskite lattice structure, and thus has the advantage of emitting light having high color purity. Also, when the core of the inorganic luminescence particle having Perovskite structure is the inorganic-organic hybrid Perovskite structure, it may be advantageous in terms of material stability.

By adjusting the composition ratio of each component, the kind and composition ratio of halogen (X) atom in the core of the inorganic luminescence particle having the Perovskite structure, it is possible to synthesize the core emitting light in various wavelengths. In addition, unlike the cores constituting other QDs or QRs, the inorganic luminescence particle having Perovskite structure has a stable lattice structure, and thus luminous efficiency can be improved.

When the EML 240 includes inorganic luminescence particles such as QDs and/or QRs, the EML 240 may be laminated through solution process, i.e. coating the dispersion solution which contains inorganic luminescence particles dissolved in a solvent, on the CTL1 250 and evaporating the solvent. The EML 240 may be laminated on the CTL1 250 using any solution process such as spin coating, drop coating, dip coating, spray coating, roll coating, flow coating casting, screen printing and inkjet printing, or a combination thereof.

In one exemplary aspect, the EML 240 may include inorganic luminescence particles such as QDs and/or QRs having photoluminescence (PL) wavelength peaks of 440 nm, 530 nm, and 620 nm so as to realize white LED. Optionally, the EML 240 may include inorganic luminescence particles such as QDs or QRs having any one of red, green and blue colors, and may be formed to emit any one color.

In an alternative aspect, the EML 240 may include organic luminescence material. The organic luminescence material is not limited to a specific organic luminescence material. As an example, the EML 240 may include organic luminescence material that emits red (R), green (G) or blue (B) light, and may include fluorescent material or phosphorescent material. As an example, the organic luminescence material in the EML 240 may include a host and a dopant. When the organic luminescence material constitutes a host-dopant system, the EML 240 may include the dopant, but is not limited to, in about 1 to about 50% by weight, and alternatively, in about 1 to about 30% by weight.

The organic host, which can be used in the EML 240, is not limited to specific organic luminescence material. As an example, the organic host in the EML 240 may include, but is not limited to, Tris(8-hydroxyquinoline)aluminum ($Alq_3$), 4,4',4''-tris(N-carbazolyl)-triphenylamine (TCTA), poly(N-vinylcarbazole) (PVK), 4,4'-bis(N-carbazolyl)-1,1'-biphenyl (CBP), 4,4'-Bis(9-carbazolyl)-2,2'-dimethylbiphenyl (CDBP), (9,10-di(naphthalene-2-yl)anthracene (ADN), 3-tert-butyl-9,10-di(naphtha-2-yl)anthracene (TBADN), 2-methyl-9,10-bis(naphthalene-2-yl)anthracene (MADN), 1,3,5-tris(N-phenylbenzimidazole-2-yl)benzene (TPBi), distyrylarylene (DSA), 1,3-bis(N-carbazolyl)benzene (mCP) and/or 1,3,5-tris(carbazol-9-yl)benzene (TCP).

When the EML 240 emits red light, the dopant in the EML 240 may include, but is not limited to, an organic compound and/or a metal complex such as 5,6,11,12-tetraphenylnaphthalene (Rubrene), (Bis(2-benzo[b]-thiophene-2-yl-pyridine)(acetylacetonate)iridium(III) (Ir(btp)2(acac)), Bis[1-(9,9-diemthyl-9H-fluorn-2-yl)-isoquinoline](acetylacetonate)iridium(III) (Ir(fliq)2(acac)), Bis[2-(9,9-diemthyl-9H-fluorn-2-yl)-quinoline](acetylacetonate)iridium(III) (Ir(flq)2(acac)), Bis-(2-phenylquinoline)(2-(3-methylphenyl)pyridinate)irideium(III) (Ir(phq)2typ) and/or Iridium(III)bis(2-(2,4-difluorophenyl)quinoline)picolinate (FPQIrpic).

When the EML 240 emits green light, the dopant in the EML 240 may include, but is not limited to, an organic compound and/or a metal complex such as N,N'-dimethyl-quinacridone (DMQA), coumarine 6,9,10-bis[N,N-di-(p-tolyl)amino]anthracene (TTPA), 9,10-bis[phenyl(m-tolyl)-amino]anthracene (TPA), bis(2-phenylpyridine)(acetylacetonate)iridium(III) (Ir(ppy)2(acac)), fac-tris(phenylpyridine)iridium(III) (fac-Ir(ppy)3) and/or tris[2-(p-tolyl)pyridine]iridium(III) (Ir(mppy)3).

When the EML 240 emits blue right, the dopant in the EML 240 may include, but is not limited to, an organic compound and/or a metal complex such as 4,4'-bis[4-(di-p-tolylamino)styryl]biphenyl (DPAVBi), perylene, 2,5,8,11-tetra-tert-butylpherylene (TBPe), bis(3,5-difluoro-2-(2-pyridyl)phenyl-(2-carbozylpyridyl)iridium(III) (FirPic), mer-tris(1-phenyl-3-methylimidazolin-2ylidene-C,C2') iridium(III (mer-Ir(pmi)3) and/or tris(2-(4,6-difluorophenyl)pyridine)iridium(III) (Ir(Fppy)3).

Alternatively, when the EML 240 includes an organic luminescence material, the EML 240 may include a delayed fluorescent material. When the EML 240 includes an organic luminescence material, the EML 240 may be laminated by any vacuum deposition process such as vacuum vapor deposition and sputtering, or by any solution process such as spin coating, drop coating, dip coating, spray coating, roll coating, flow coating, casting, screen printing and inkjet printing, or a combination thereof. For example, the EML 240 may have a thickness, but is not limited to, between about 5 nm and 300 nm, and alternatively, about 10 nm and 200 nm.

In this aspect, the CTL1 250 may be a hole transfer layer which provides holes with the EML 240. As an example, the CTL1 250 may include a hole injection layer (HIL) 252 disposed adjacently to the first electrode 210 between the first electrode 210 and the EML 240, and a hole transport layer (HTL) 254 disposed adjacently to the EML 240 between the first electrode 210 and the EML 240.

The HIL 252 facilitates the injection of holes from the first electrode 210 into the EML 240. As an example, the HIL 252 may include, but is not limited to, an organic material selected from the group consisting of poly(ethylenedioxythiophene):polystyrenesulfonate (PEDOT:PSS); 4,4',4"-tris (diphenylamino)triphenylamines (TDATA) doped with tetrafluoro-tetracyano-quinodimethane (F4-TCNQ); p-doped phthalocyanine such as zinc phthalocyanine (ZnPc) doped with F4-TCNQ; N,N'-diphenyl-N,N'-bis(1-naphthyl)-1,1'-biphenyl-4,4"-diamine (α-NPD) doped with F4-TCNQ; hexaazatriphenylene-hexanitrile (HAT-CN); and a combination thereof. As an example, the HIL 252 may include the dopant such as F4-TCNQ in about 1 to about 30% by weight. The HIL 252 may be omitted in compliance with a structure of the LED D1.

The HTL 254 transports holes from the first electrode 210 into the EML 240. The HTL 254 may include an inorganic material or an organic material. As an example, when the HTL 254 includes an organic material, the HTL 254 may include, but is not limited to, 4,4'-bis(p-carbazolyl)-1,1'-biphenyl compounds such as CBP and CDBP; aromatic amines, i.e. aryl amines or polynuclear aromatic amines selected from the group consisting of α-NPD, N,N'-diphenyl-N,N'-bis(3-methylphenyl)-(1,1'-biphenyl)-4,4'-diamine (TPD), N,N'-bis(3-methylphenyl)-N,N'-bis(phenyl)-spiro (spiro-TPD), N,N'-di(4-(N,N'-diphenyl-amino)phenyl)-N, N'-diphenylbenzidine (DNTPD), TCTA, tetra-N-phenylbenzidine (TPB), tris(3-methylphenylphenylamino)-triphenylamine (m-MTDATA), poly(9,9'-dioctylfluorenyl-2,7-diyl)-co-(4,4'-(N-(4-sec-butylphenyl)diphenylamine (TFB), poly(4-butylphenyl-dipnehyl amine) (poly-TPD) and combination thereof; conductive polymers such as polyaniline, polypyrrole, PEDOT:PSS; PVK and its derivatives; poly (para)phenylene vinylenes (PPV) and its derivatives such as poly [2-methoxy-5-(2-ethylhexyloxy)-1,4-phenylene vinylene] (MEH-PPV), poly [2-methoxy-5-(3',7'-dimethyloctyloxy)-1,4-phenylene vinylene] (MOMO-PPV); polymethacrylate and its derivatives; poly(9,9-octylfluorene) and its derivatives; poly(spiro-fluorene) and its derivatives; metal complexes such as copper phthalocyanine (CuPc); and combination thereof.

Figure 3:
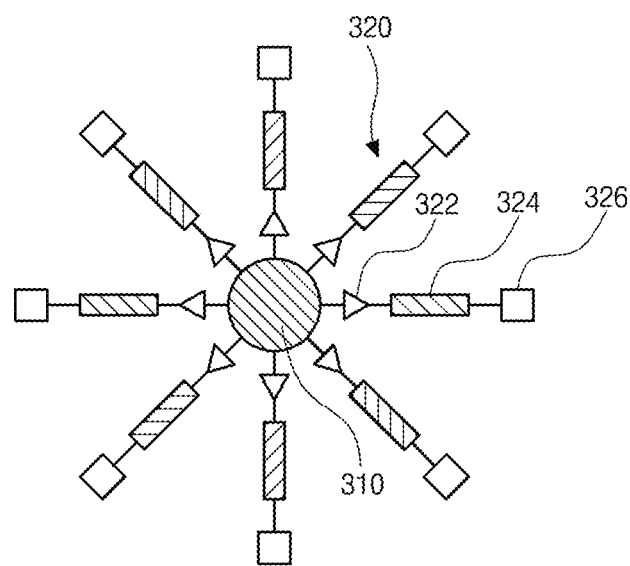
FIG. 3 is a schematic diagram illustrating a structure of an inorganic material that can be introduced into a charge transfer layer in accordance with the present disclosure.

Alternatively, when the HTL 252 includes an inorganic material, the HTL 254 may include an inorganic material in which an amphiphilic ligand is bound to a surface of an inorganic nano particle. FIG. 3 is a schematic diagram illustrating a structure of an inorganic material that can be introduced into a charge transfer layer in accordance with the present disclosure. As illustrated in FIG. 3, an inorganic material 300, which may be contained at least one of the CTL1 and CTL2 250 and 270, includes an amphiphilic ligand 320 that is bound to a surface of an inorganic nano particle 310.

In one exemplary aspect, the inorganic nano particle 310 may comprise a metal oxide nano particle. The metal oxide nano particle that can be used in the HTL 254 may comprise, but is not limited to, an oxide nano particle of a metal component selected from the group consisting of Zn, Ti, Ni, Co, Cu, W, Sn, Cr, V, Mo, Mn, Pb, Ce, Re and combination thereof. For example, the metal oxide nano particle 310 that can be used in the HTL 254 may be selected from, but is not limited to, the group consisting of ZnO, $TiO_2$, CoO, CuO, $Cu_2O$, FeO, $In_2O_3$, MnO, NiO, PbO, SnOx, $Cr_2O_3$, $V_2O_5$, $Ce_2O_3$, $MoO_3$, $Bi_2O_3$, $ReO_3$ and combination thereof.

Figure 4:
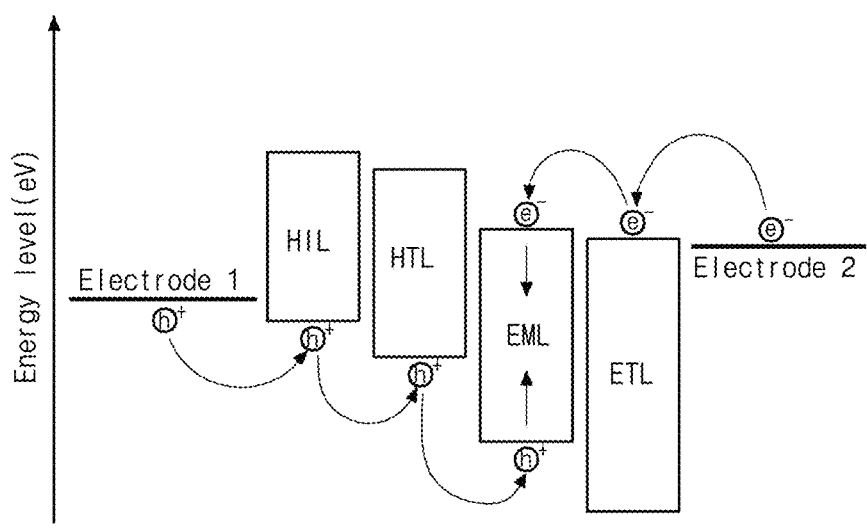
FIG. 4 is a schematic diagram illustrating HOMO and LUMO energy levels among materials in an emissive layer and electrodes in accordance with one exemplary aspect of the present disclosure.

In this case, as illustrated in FIG. 4, the HOMO (Highest Occupied Molecular Orbital) energy level, corresponding to the VB energy level in case of inorganic material, of the HTL 254 should be shallower than the HOMO energy level of the EML 240 so that holes can be injected into the EML 240 efficiently.

Alternatively, the HTL 254 may further comprise a component (p-dopant) p-doped with the inorganic nano particle 310 in the inorganic material 300 so that the HTL 254 comprising the inorganic material 300 such as metal oxide nano particle can have an adjusted VB energy level to inject holes efficiently into the EML 240. As an example, the component p-doped with the inorganic nano particle 310 may comprise, but is not limited to, $Li^+$, $Na^+$, $K^+$, $Sr^+$, $Ni^{2+}$, $Mn^{2+}$, $Pb^{2+}$, $Cu^+$, $Cu^{2+}$, $Co^{2+}$, $Al^{3+}$, $Eu^{3+}$, $In^{3+}$, $Ce^{3+}$, $Er^{3+}$, $Tb^{3+}$, $Nd^{3+}$, $Y^{3+}$, $Cd^{2+}$, $Sm^{3+}$, N, P, As and combination thereof.

The amphiphilic ligand 320 may comprise an anchor portion 322 that forms one end thereof and bound directly to the surface of the inorganic nano particle 310, a first moiety 324 bound to the anchor portion 322 and a second moiety 326 bound to the first moiety 324 and exposed externally. In this case, one of the first moiety 324 and the second moiety 326 is a hydrophobic group and the other of the first moiety 324 and the second moiety 326 is a hydrophilic group. For example, the first moiety 324 may be a hydrophobic group and the second moiety 326 may be a hydrophilic group.

In one exemplary aspect, the anchor portion 322 may comprise, but is not limited to, a thiol group (—SH), a sulfide group (—S—) or an amino group (—$NH_2$—). The first moiety 324, which can be a hydrophobic group, may comprise, but is not limited to, a saturated or unsaturated aliphatic chain, an alicyclic ring, an aromatic ring and a hetero aromatic ring. The second moiety 325, which can be a hydrophilic group, may comprise, but is not limited to, a hydroxyl group (—OH) and a carboxylic group (—COOH).

The first moiety 324 located between the anchor portion 322 and the second moiety 326 is not particularly limited as long as it can prevent the inorganic nano particle 310 from aggregating due to the close arrangements among the adjacent inorganic nano particles 310. As an example, the first moiety 324 may comprise, but is not limited to, a $C_2$-$C_{15}$ aliphatic chain, a $C_3$-$C_{20}$ alicyclic ring, a $C_6$-$C_{24}$ aromatic ring and a $C_3$-$C_{24}$ hetero aromatic ring, for example, a pyridine ring, a pyrimidine ring, an (iso) quinoline ring and an aza ring. The $C_2$-$C_{15}$ aliphatic chain may comprises, but is not limited to, a saturated aliphatic linker such as $C_2$-$C_{15}$ alkylene (or polymethylene). The $C_6$-$C_{24}$ aromatic ring may comprise, but is not limited to, an aromatic linker such as phenylene, biphenylene, naphthylene, anthracenylene, terphenylene, and the like. The $C_3$-$C_{24}$ hetero aromatic ring may comprise, but is not limited to, a hetero aromatic linker such as pyridylene, pyrimidylene, (iso) quinolylene, and the like.

The inorganic material 300 may be synthesized by using a precursor for the inorganic nano particle 310 and an amphiphilic ligand 320 as starting materials by sol-gel method and the like. As an example, when using the metal oxide nano particle as the inorganic nano particle, the precursor for the inorganic nano particle 310 is added into an adequate solvent to synthesize the metal oxide nano particle 310, and then the amphiphilic ligand 320 is added to the metal oxide nano particle 310 so that the amphiphilic ligand 320 is bound to the surface of the metal oxide nano particle 310.

For example, as the contents of the precursor for the metal oxide nano particle 310 is increased, one moiety of the anchor portion 322 and the second moiety 326 is bound to the surface of the metal oxide nano particle 310 and the other moiety is exposed externally by relative binding energy differences between the metal component present on the surface of the metal oxide nano particle 310, the anchor portion 322 and the second moiety 326 each of which is present on one end of the amphiphilic ligand 320. For example, when the amphiphilic ligand 320 having the thiol group as the anchor portion 322, a hydrophilic hydroxyl group as the second moiety 326 and a hydrophobic alkylene group between the thiol group and the hydroxyl group is used, the thiol group (—SH) has relatively low binding energy for the cationic metal component present on the surface of the metal oxide nano particle 310 compared to the hydroxyl group. In this case, the thiol group as the anchor portion 322 is directly bound to the surface of the metal oxide nano particle 310 and the hydroxyl group as the hydrophilic group is exposed externally. When the contents of the metal component for synthesizing the metal oxide nano particle 320 are relatively large, the thiol group may be bound to the surface of the metal oxide nano particle 310 in the form of a sulfide group (—S—).

In FIG. 2, while the CTL1 250 is divided into the HIL 252 and the HTL 254, the CTL1 250 may have a mono-layered structure. For example, the CTL1 250 may include only the HTL 254 without the HIL 252 or may include the above-mentioned hole transporting material doped with the hole injection material (e.g. PEDOT:PSS).

The CTL1 250 including the HIL 252 and the HTL 254 may be laminated by any vacuum deposition process such as vacuum vapor deposition and sputtering, or by any solution process such as spin coating, drop coating, dip coating, spray coating, roll coating, flow coating, casting, screen printing and inkjet printing, or a combination thereof. For example, each of the HIL 252 and the HTL 254 may have a thickness, but is not limited to, between about 10 nm and 200 nm, alternatively, about 10 nm and 100 nm.

The CTL2 270 is disposed between the EML 240 and the second electrode 230. The CTL2 270 may be an electron transfer layer which provides electrons into the EML 240. In one exemplary aspect, the CTL2 270 may include an electron injection layer (EIL) 272 disposed adjacently to the second electrode 230 between the second electrode 230 and the EML 240, and an electron transport layer (ETL) 274 disposed adjacently to the EML 240 between the second electrode 230 and the EML 240.

The EIL 272 facilitates the injection of electrons from the second electrode 230 into the EML 240. For example, the EIL 272 may include, but is not limited to, a metal such as Al, Cd, Cs, Cu, Ga, Ge, In and/or Li, each of which is undoped or doped with fluorine; and/or metal oxide such as $TiO_2$, ZnO, $ZrO_2$, $SnO_2$, $WO_3$ and/or $Ta_2O_3$, each of which is undoped or doped with Al, Mg, In, Li, Ga, Cd, Cs or Cu.

The ETL 274 transfers electrons into the EML 240. In one exemplary aspect, when the EML 240 includes inorganic luminescence particles, the ETL 274 may include an inorganic material so as to prevent an interface defect from being formed at an interface between the EML 240 and the ETL 274, and thereby securing driving stability of the LED D1. In addition, when the ETL 274 includes an inorganic material having high charge mobility, the electron transport rate provided from the second electrode 230 may be improved, and electrons can be transported efficiently into the EML 240 owing to high electron levels or concentrations.

Moreover, when the EML 240 includes an inorganic luminescence particle, the inorganic luminescence particle typically has a very deep VB energy level compared to the HOMO energy level of the organic luminescence material. An organic compound having electron transporting property typically has a shallower HOMO energy level than the VB energy level of the inorganic luminescence particle. In this case, the holes, injected from the first electrode 210 into the EML 240 having the inorganic luminescence particles, may be leaked toward the second electrode 230 via the ETL 274 including the organic compound as an electron transporting material.

In one exemplary aspect, the ETL 274 may include an inorganic material having relatively deep VB energy level compared to VB energy level or HOMO energy level of the material in the EML 240. As an example, an inorganic material having wide energy level bandgap (Eg) between the VB energy level and a conduction band energy level, which corresponds to the lowest unoccupied molecular orbital (LUMO) energy level of an organic compound, may be used as an electron transporting material of the ETL 274. In this case, the holes, injected from the first electrode 210 into the EML 240 having the inorganic luminescence particles, cannot be leaked to the ETL 274, and electrons provided from the second electrode 230 can be injected efficiently into the EML 240.

In one exemplary aspect, the ETL 274 may comprise the inorganic material 300 in which the amphiphilic ligand 320 is bound to the surface of the inorganic nano particle 310, as illustrated in FIG. 3. The inorganic nano particle 310 in the ETL 274 may be the metal oxide nano particle.

As an example, the metal oxide nano particle 310 in the ETL 274 may comprise, but is not limited to, an oxide nano particle of a metal component selected from the group consisting of Zn, Ca, Mg, Ti, Sn, W, Ta, Hf, Al, Zr, Ba and combination thereof. More specifically, the metal oxide in the ETL 274 may comprise, but is not limited to, $TiO_2$, ZnO, ZnMgO, ZnCaO, $ZrO_2$, $SnO_2$, SnMgO, $WO_3$, $Ta_2O_3$, $HfO_3$, $Al_2O_3$, $BaTiO_3$, $BaZrO_3$ and combination thereof. The amphiphilic ligand 320 bound to the surface of the inorganic nano particle 310 in the ETL 274 may be identical to the amphiphilic ligand in the HTL 254.

In one exemplary aspect, as illustrated in FIG. 4, the ETL 274 may be designed to have the LUMO (or conduction band) energy level substantially equal to the LUMO energy level of the EML 240 while the HOMO (or VB) energy level deeper than the HOMO energy level of the EML 240. To this end, the ETL 274 may further comprise a component (n-dopant) doped with the inorganic material 300 in which the amphiphilic ligand 320 is bound to the surface of the inorganic nano particle 310. The n-dopant may comprise, but is not limited to, metal cation such as Al, Mg, In, Li, Ga, Cd, Cs, Cu and the like, particularly trivalent cation.

When the ETL 274 comprises an organic material, the ETL 274 may comprise, but is not limited to, oxazole-based compounds, isoxazole-based compounds, triazole-based compounds, isotriazole-based compounds, oxadiazole-based compounds, thiadiazole-based compounds, phenanthroline-based compounds, perylene-based compounds, benzoxazole-based compounds, benzothiazole-based compounds, benzimidazole-based compounds, triazine-based compounds and aluminum complexes.

More specifically, the organic material in the ETL 274 may comprise, but is not limited to, 3-(4-Biphenyl)-4-phenyl-5-tert-butylphenyl-1,2,4-triazole (TAZ), 2,9-Dimethyl-4,7-diphenyl-1,10-phenaathroline (bathocuproine, BCP), 1,3,5-benzinetriyl)-tris(1-phenyl-1-H-benzimidazole (TPBi), tris-(8-hydroxyquinoline aluminum ($Alq_3$), bis(2-methyl-8-quninolinato)-4-phenylphenolatealuminum (III) (BAlq), bis(2-methyl-quinolinato)(tripnehylsiloxy) aluminum (III) (Salq) and combination thereof.

Similar to the CTL1 250, while FIG. 2 illustrates the CTL2 270 as a bi-layered structure including the EIL 272 and the ETL 274, the CTL2 270 may have a mono-layered structure having only the ETL 274. Alternatively, the CTL2 270 may have a mono-layered structure of ETL 274 including a blend of the above-described electron-transporting inorganic material with cesium carbonate.

The CTL2 270, which includes the EIL 272 and/or the ETL 274 having the inorganic material, may be laminated on the EML 240 by any vacuum deposition process such as vacuum vapor deposition and sputtering, or solution process such as spin coating, drop coating, dip coating, spray coating, roll coating, flow coating, casting, screen printing and inkjet printing, or combination thereof. As an example, each of the EIL 272 and the ETL 274 may have a thickness, but is not limited to, between about 10 nm and about 200 nm, alternatively, about 10 nm and 100 nm.

For example, the LED D1 may have a hybrid CTL structure in which the HTL 254 of the CTL1 250 includes the organic material as describe above and the CTL2 270, for example, the ETL 274 includes the inorganic material as described above. In this case, The LED D1 may enhance its luminous properties.

When holes are transported to the second electrode 230 through the EML 240, or electrons are transported to the first electrode 310 through the EML 240, the lifetime and efficiency of the LED D1 may be reduced. To prevent such deterioration, the LED D1 may further include at least one exciton blocking layer disposed adjacently to the EML 240.

For example, the LED D1 may include the EBL 260 capable of controlling and preventing the transfer of electrons between the HTL 254 and the EML 240. As an example, the EBL 260 may include, but is not limited to, TCTA, tris[4-(diethylamino)phenyl]amine), N-(biphenyl-4-yl)-9,9-dimethyl-N-(4-(9-phenyl-9H-carbazole-3-yl)phenyl)-9H-fluorene-2-amine, tri-p-tolylamine, 1,1-bis(4-(N, N'-di(ptolyl)amino)phenyl)cyclohexane (TAPC), m-MTDATA, mCP, mCBP, Poly-TPD, CuPc, DNTPD, 1,3, 5-tris[4-(diphenylamino)phenyl]benzene (TDAPB) and combination thereof.

In addition, the LED D1 may include the HBL 280 capable controlling and preventing the transfer of holes between the ETL 274 and the EML 240. In one exemplary aspect, the HBL 280 may include, but is not limited to, oxazole-based compounds, isoxazole-based compounds, triazole-based compounds, isotriazole-based compounds, oxadiazole-based compounds, thiadiazole-based compounds, phenanthroline-based compounds, perylene-based compounds, benzoxazole-based compounds, benzothiazole-based compounds, benzimidazole-based compounds, triazine-based compounds and aluminum complexes. For example, the HBL 280 may include, but is not limited to, 2,9-dimethyl-4,7-diphenyl-1,10-phenanthroline (BCP), BAlq, Alq$_3$, PBD, spiro-PBD and/or Liq, which have/has a deeper HOMO energy level than that of the material used for the EML 240, In accordance with the present disclosure, at least one of the HTL 254 of the CTL1 250 and the ETL 274 of the CTL2 270 may comprise the inorganic material 300 in which the amphiphilic ligand 320 is bound to the surface of the inorganic nano particle 310.

There exist oxide ion ($O^{2-}$) and/or oxo anion ($O_x^{y-}$) on the surface of the CTL1 and CTL2 254 and 274 made of an ionic solid, i.e. the metal oxide nano particles 310. Such anions react with water under hydrophilic condition to transform to a hydroxyl group (—OH) or to form a hydroxyl ion. That is, there exists metal hydroxide (M-OH) on the exposed surface of the CTL1 and CTL2 254 and 274 made only of the metal oxide nano particle 310.

The oxide ion, oxo cation and the hydroxyl group derived from those anions formed on the surface of the CTLs 254 and 274 made only of the metal oxide nano particle 310 may cause the surface defects in those CTLs 254 and 274. For example, as oxide ion or oxo anion on the surface of the CTLs 254 and 274 made only of metal oxide is oxidized, metal oxide film is formed on the surface of the CTLs 254 and 274. As a result, as the stability of the CTLs 254 and 274 made only of metal oxide is lowered, electrical properties such as electron mobility in those CTLs 254 and 274 is reduced as time passed.

Also, when the CTLs 254 and 274 made only of metal oxide nano particle without amphiphilic ligand is laminated using the solution process, the metal oxide nano particle aggregates with adjacent metal oxide nano particle, thereby deteriorating dispersion property thereof. As a result, in case of laminating the thin-film type CTLs 254 and 274, there exists non-uniform phenomenon such as voids and aggregations on the thin film.

In addition, when the CTLs 254 and 274 made of inorganic material in which a hydrophobic ligand is bound is laminated, the solution process should be performed in which the metal oxide nano particle to which the hydrophobic ligand is bound are dispersed in a hydrophobic organic solvent. When the EML 240 adjacent to the CTLs 254 and 274 comprises the inorganic luminescence material, the EML 240 is laminated by the solution process using a hydrophobic organic solvent. When the CTLs 254 and 274 and the EML 240 are laminated using the same kind of hydrophobic organic solvent, the materials constituting the CTLs 254 and the 274 and the EML 240 are mixed. The interface between the EML 240 and the CTLs 254 and 274 cannot be clearly separated and the interface morphology among these layers may be deteriorated, and thereby decreasing the luminous efficiency and/or the luminous lifetime of the LED.

On the contrary, at least one of the CTLs 254 and 274 comprises the inorganic material 300 having the amphiphilic ligand 320 bound to the surface of the inorganic nano particle 310. The amphiphilic ligand 320 formed on the surface of the nano particle 310 can remove the surface defects on the inorganic nano particle 310. In addition, due to the amphiphilic ligand 320 bound to the surface of the inorganic nano particle 310, it is possible to secure a predetermined distance between the adjacently dispersed inorganic nano particles 310. Accordingly, it is possible to minimize the aggregations of the inorganic nano particles 310 with the adjacent inorganic nano particles 310, thereby improving the dispersion properties of the inorganic material 300 and minimizing voids or aggregations when laminating thin film.

In addition, the amphiphilic ligand 320 is designed to have the second moiety 326 located at the outmost side within the molecule as a hydrophilic group, the inorganic material 300 may be dispersed efficiently in the hydrophilic organic solvents. Unlike the EML 240 laminated by a solution process using a hydrophobic organic solvent, the CTLs 254 and 274 including the inorganic material 300 can be laminated through a solution process using a hydrophilic organic solvent. Since each of the CTLs 254 and 274 and the adjacently laminated EML 240 can be laminated using orthogonal solvents, materials constituting these layers are not mixed each other, and therefore, the interface morphology among the CTLs 254 and 274 and the EML 240 is not deteriorated. As a result, it is possible to realize the LED D1 that improved significantly its luminous properties and luminous lifetime by introducing the inorganic material 300 having the amphiphilic ligand 320 bound to the surface of the inorganic nano particle 310 into at least one of the CTLs 254 and 274.

Figure 5:
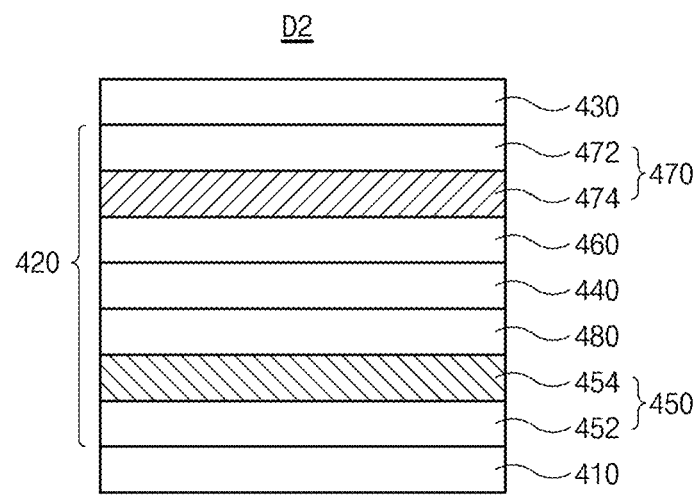
FIG. 5 is a schematic cross-sectional view illustrating a light emitting diode having an inverted structure in accordance with another exemplary aspect of the present disclosure.
Figure 6:
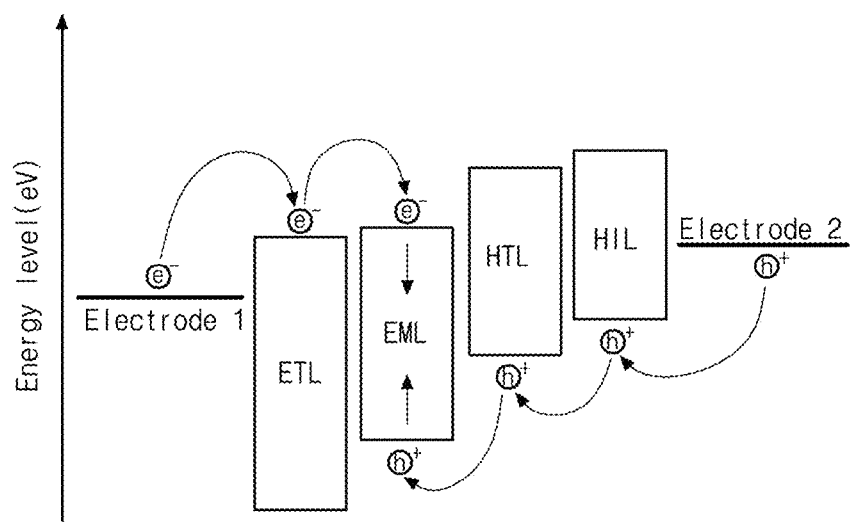
FIG. 6 is a schematic diagram illustrating HOMO and LUMO energy levels among materials in an emissive layer and electrodes in accordance with another exemplary aspect of the present disclosure.

In the above aspect, the LED D1 having a normal structure in which comprises the hole transfer layer 250 disposed between the first electrode 210 having relatively low work function value and the EML 240 and the electron transfer layer 260 disposed between the EML 240 and the second electrode 230 having relatively high work function value. On the contrary, the LED may have an inverted structure. FIG. 5 is a schematic cross-sectional view illustrating a light emitting diode having an inverted structure in accordance with another exemplary aspect of the present disclosure. FIG. 6 is a schematic diagram illustrating HOMO and LUMO energy levels among materials in an emissive layer and electrodes in accordance with another exemplary aspect of the present disclosure.

As illustrated in FIG. 5, an LED D2 comprises a first electrode 410, a second electrode 430 facing the first electrode 410 and an emissive layer 420 disposed between the first and second electrodes 410 and 430. The emissive layer 420 comprises an EML 440. The emissive layer 420 comprises a CTL1 450 disposed between the first electrode 410 and the EML 440 and a CTL2 470 disposed between the EML 440 and the second electrode 430. At least one of the CTL1 450 and the CTL2 470 may comprise the inorganic material 300. Alternatively, the emissive layer 420 may further comprise a HBL 480 disposed between the CTL1 450 and the EML 440 and/or an EBL 460 disposed between the EML 440 and the CTL2 470.

In this aspect, the first electrode 410 may be a cathode such as an electron injection electrode. For example, the first electrode 410 may include, but is not limited to, a doped or undoped metal oxide such as ITO, IZO, ITZO, ICO, $SnO_2$, $In_2O_3$, Cd:ZnO, F:$SnO_2$, In:$SnO_2$, Ga:$SnO_2$ and AZO. Optionally, the first electrode 410 may include a metal or nonmetal material such as Ni, Pt, Au, Ag, Ir and CNT, other than the above-described metal oxide.

The second electrode 430 may be an anode such as a hole injection electrode. As an example, the second electrode 430 may include, but are not limited to, Ca, Ba, Ca/Al, LiF/Ca, LiF/Al, $BaF_2$/Al, CsF/Al, $CaCO_3$/Al, $BaF_2$/Ca/Al, Al, Mg, Au:Mg or Ag:Mg. As an example, each of the first electrode 410 and the second electrode 430 may have a thickness of, but are not limited to, about 30 to about 300 nm.

The EML 440 may include inorganic luminescence particles or organic luminescence material. As an example, the EML 440 may include the inorganic luminescence particles such as QDs or QRs. The QDs or QRs may have a single-layered structure or a multiple-layered heterologous structure, i.e. core/shell structure. In this case, each of the core and the shell may have a single layer or multiple layers, respectively. The QDs or QRs may have type I core/shell structure, type II core/shell structure or reverse type I core/shell structure.

In one exemplary aspect, each of the core and shell may be a semiconductor nanocrystal or metal oxide nanocrystal. For example, the semiconductor nanocrystal of the core and/or the shell may be selected from the group, but is not limited to, consisting of Group II-VI compound semiconductor nanocrystal, Group III-V compound semiconductor nanocrystal, Group IV-VI compound semiconductor nanocrystal, Group compound semiconductor nanocrystal and combination thereof.

When the EML 440 includes organic luminescence material, the EML 440 may include organic luminescence material that emits red (R), green (G) or blue (B) light, and may include fluorescent material or phosphorescent material. As an example, the organic luminescence material in the EML 440 may include a host and a dopant. When the organic luminescence material constitutes a host-dopant system, the EML 440 may include the dopant, but is not limited to, in about 1 to about 50% by weight, and alternatively, in about 1 to about 30% by weight. Alternatively, when the EML 440 includes an organic luminescence material, the EML 440 may include a delayed fluorescent material. The EML 440 may be laminated by any vacuum deposition process or by any solution process. For example, the EML 440 may have a thickness, but is not limited to, between about 5 nm and 300 nm, and alternatively, about 10 nm and 200 nm.

In this aspect, the CTL1 450 may be an electron transfer layer which provides electrons into the EML 440. In one exemplary aspect, the CTL1 450 may include an EIL 452 disposed adjacently to the first electrode 410 between the first electrode 410 and the EML 440, and an ETL 454 disposed adjacently to the EML 440 between the first electrode 410 and the EML 440.

The EIL 452 may include, but is not limited to, a metal such as Al, Cd, Cs, Cu, Ga, Ge, In and/or Li, each of which is undoped or doped with fluorine; and/or metal oxide such as $TiO_2$, ZnO, $ZrO_2$, $SnO_2$, $WO_3$ and/or $Ta_2O_3$, each of which is undoped or doped with Al, Mg, In, Li, Ga, Cd, Cs or Cu.

The ETL 454 may include an inorganic material or an organic material. As an example, the ETL may include an inorganic material that has superior charge mobility and has HOMO (or VB) energy level deeper than the HOMO energy level of the EML 440. In one exemplary aspect, the ETL 454 may include the inorganic material 300 in which the amphiphilic ligand 320 is bound to the surface of the inorganic nano particle 310, as illustrated in FIG. 3. The inorganic nano particle 310 in the ETL 454 may be the metal oxide nano particle.

As an example, the metal oxide nano particle 310 in the ETL 454 may comprise, but is not limited to, an oxide nano particle of a metal component selected from the group consisting of Zn, Ca, Mg, Ti, Sn, W, Ta, Hf, Al, Zr, Ba and combination thereof. More specifically, the metal oxide in the ETL 454 may comprise, but is not limited to, $TiO_2$, ZnO, ZnMgO, ZnCaO, $ZrO_2$, $SnO_2$, SnMgO, $WO_3$, $Ta_2O_3$, $HfO_3$, $Al_2O_3$, $BaTiO_3$, $BaZrO_3$ and combination thereof.

In one exemplary aspect, as illustrated in FIG. 6, the ETL 454 may be designed to have the HOMO (or VB) energy level deeper than the HOMO energy level of the EML 240. To this end, the ETL 454 may further comprise a component (n-dopant) n-doped with the inorganic material 300 in which the amphiphilic ligand 320 is bound to the surface of the inorganic nano particle 310. The n-dopant may comprise, but is not limited to, metal cation such as Al, Mg, In, Li, Ga, Cd, Cs, Cu and the like, particularly trivalent cation.

When the ETL 454 comprises an organic material, the ETL 454 may comprise, but is not limited to, oxazole-based compounds, isoxazole-based compounds, triazole-based compounds, isotriazole-based compounds, oxadiazole-based compounds, thiadiazole-based compounds, phenanthroline-based compounds, perylene-based compounds, benzoxazole-based compounds, benzothiazole-based compounds, benzimidazole-based compounds, triazine-based compounds and aluminum complexes.

The CTL1 450 may have a mono-layered structure having only the ETL 454. Alternatively, the CTL1 450 may have a mono-layered structure of ETL 454 including a blend of the above-described electron-transporting inorganic material with cesium carbonate. The CTL1 450 including the EIL 452 and/or the ETL 454 may be laminated on the first electrode 410 by any vacuum deposition process or any solution process. As an example, each of the EIL 452 and the ETL 454 may have a thickness, but is not limited to, between about 10 nm and about 200 nm, alternatively, about 10 nm and 100 nm.

In this aspect, the CTL2 470 may be an electron transfer layer which provides electrons with the EML 440. The CTL2 470 may include a HIL 472 disposed adjacently to the second electrode 430 between the second electrode 430 and the EML 440, and a HTL 474 disposed adjacently to the EML 440 between the second electrode 430 and the EML 440.

The HIL 452 may include, but is not limited to, an organic material selected from the group consisting of PEDOT:PSS; TDATA doped with F4-TCNQ; p-doped phthalocyanine such as ZnPc doped with F4-TCNQ; α-NPD) doped with F4-TCNQ; HAT-CN; and a combination thereof. As an example, the HIL 472 may include the dopant such as F4-TCNQ in about 1 to about 30% by weight. The HIL 472 may be omitted in compliance with a structure of the LED D2.

The HTL 474 transports holes from the second electrode 430 into the EML 440. The HTL2 474 may include an inorganic material or an organic material. When the HTL 474 includes an organic material, the HTL 474 may include, but is not limited to, 4,4'-bis(p-carbazolyl)-1,1'-biphenyl compounds such as CBP and CDBP; aromatic amines, i.e. aryl amines or polynuclear aromatic amines selected from the group consisting of α-NPD, TPD, spiro-TPD, (DNTPD, TCTA, TPB, m-MTDATA, TFB, poly-TPD and combination thereof; conductive polymers such as polyaniline, polypyrrole, PEDOT:PSS; PVK and its derivatives; PPV and its derivatives such as MEH-PPV, MOMO-PPV; polymethacrylate and its derivatives; poly(9,9-octylfluorene) and its derivatives; poly(spiro-fluorene) and its derivatives; metal complexes such as CuPc; and combination thereof.

When the HTL 474 includes an inorganic material, the HTL 474 may include the inorganic material 300 in which the amphiphilic ligand 320 is bound to the surface of the inorganic nano particle 310, as illustrated in FIG. 3. The inorganic nano particle 310 in the HTL 464 may be the metal oxide nano particle.

The metal oxide nano particle in the HTL 474 may comprise, but is not limited to, an oxide nano particle of a metal component selected from the group consisting of Zn, Ti, Ni, Co, Cu, W, Sn, Cr, V, Mo, Mn, Pb, Ce, Re and combination thereof. For example, the metal oxide nano particle 310 that can be used in the HTL 474 may be selected from, but is not limited to, the group consisting of ZnO, $TiO_2$, CoO, CuO, $Cu_2O$, FeO, $In_2O_3$, MnO, NiO, PbO, SnOx, $Cr_2O_3$, $v_2O_5$, $Ce_2O_3$, $MoO_3$, $Bi_2O_3$, $ReO_3$ and combination thereof.

In this case, as illustrated in FIG. 6, the HOMO (or VB) energy level of the HTL 474 should be shallower than the HOMO energy level of the EML 440 so that holes can be injected into the EML 440 efficiently. Alternatively, the HTL 454 may further comprise a component (p-dopant) p-doped with the inorganic nano particle 310 in the inorganic material 300 so that the HTL 454 comprising the inorganic material 300 such as metal oxide nano particle can have an adjusted VB energy level to inject holes efficiently into the EML 440. As an example, the component p-doped with the inorganic nano particle 310 may comprise, but is not limited to, $Li^+$, $Na^+$, $K^+$, $Sr^+$, $Ni^{2+}$, $Mn^{2+}$, $Pb^{2+}$, $Cu^+$, $Cu^{2+}$, $CO^{2+}$, $Al^{3+}$, $Eu^{3+}$, $In^{3+}$, $Ce^{3+}$, $Er^{3+}$, $Tb^{3+}$, $Nd^{3+}$, $Y^{3+}$, $Cd^{2+}$, $Sm^{3+}$, N, P, As and combination thereof.

In FIG. 5, while the CTL2 470 is divided into the HIL 472 and the HTL 474, the CTL2 470 may have a mono-layered structure. For example, the CTL2 470 may include only the HTL 474 without the HIL 472 or may include the above-mentioned hole transporting material doped with the hole injection material (e.g. PEDOT:PSS).

The CTL2 470 including the HIL 472 and the HTL 474 may be laminated by any vacuum deposition process or by any solution process. For example, each of the HIL 472 and the HTL 474 may have a thickness, but is not limited to, between about 10 nm and 200 nm, alternatively, about 10 nm and 100 nm.

In an alternative aspect, the LED D2 may include the EBL 460 capable of controlling and preventing the transfer of electrons between the HTL 474 and the EML 440 and/or the HBL 480 capable controlling and preventing the transfer of holes between the ETL 454 and the EML 440.

At least one of the ETL 454 of the CTL1 450 and the HTL 474 of the CTL2 470 may comprise the inorganic material 300 in which the amphiphilic ligand 320 is bound to the surface of the inorganic nano particle 310. The amphiphilic ligand 320 enables defects on the surface of the inorganic nano particle 310 to be minimized, and thus prevents the electrical properties of the inorganic nano particle 310 from being deteriorated. In addition, the amphiphilic ligand 320 prevents adjacently disposed inorganic nano particles 310 from being aggregated, thus the charge transfer material, i.e. the inorganic material 300 in the CTLs 454 and 474 cannot be aggregated and can prevent voids from forming in the thin film. Moreover, it is possible to form the CTLs 454 and 474 by the solution process using a hydrophilic organic solvent. Accordingly, the material formed by the solution process using a hydrophobic solvent in the EML 440 and the materials formed by the solution process using the hydrophilic solvent in the CTLs 454 and 474 adjacently to the EML 440 are not mixed each other. As a result, the interface morphology among the CTLs 254 and 274 and the EML 240 is not deteriorated, and therefore, it is possible to realize the LED D2 that improved significantly its luminous properties and luminous lifetime.

SYNTHESIS EXAMPLE 1

Synthesis ZnMgO Nano Particle Having Amphiphilic Ligand

ZnMgO nano particle to which an amphiphilic ligand is bound was synthesized using the following materials: Tetramethylammoniun hydroxide (TMAH, 98%), dimethyl sulfoxide (DMSO, 99.9%), zinc acetate dihydrate $((CH_3COO)_2Zn·2H_2O$, 98.5%), magnesium acetate tetrahydrate$((CH_3COO)_2Mg·4H_2O$, 99.9%), Ethanol (EtOH) (Anhydrous, ≥99.5%), Toluene (Anhydrous, 99.8%).

Zinc acetate (0.93 g), magnesium acetate tetrahydrate (0.16 g) and DMSO (50 mL) were added into a 2-neck reaction flask, and then the solution was stirred until the solution was transparent. TMAH dissolved in EtOH was added drop wisely to the solution and the mixtures was reacted for 4 hours with stirring to obtain ZnMgO without a ligand. An amphiphilic ligand, 6-mercaptohexanoic acid (≥98%) 1.126 g (7.5 mmol) was injected into the reaction flask and then mixture was reacted overnight with stirring. The reaction solution was precipitated in EtOH, and the solvent was removed with centrifugation. The obtained particles were re-dispersed in a small amount of toluene and re-precipitated in EtOH. Steps of EtOH precipitation, solvent removal, re-dispersion and re-precipitation were repeated 2-3 times, and then finally re-dispersed in anhydrous EtOH to give ZnMgO nano particles in which a 6-mercaptohexanoic acid ligand is bound to the surface thereof.

SYNTHESIS EXAMPLES 2-7

Synthesis ZnMgO Nano Particle Having Amphiphilic Ligand

ZnMgO nano particles in which amphiphilic ligand is bound to the surface thereof were synthesized using the same materials and repeating the same procedure as Example 1, except using each of 2-mercaptoproponic acid 7.6 mmol (Synthesis Example 2), 11-mercaptoundecanic acid 7.6 mmol (Synthesis Example 3), 2-mercaptoethanol 7.6 mmol (Synthesis Example 4), 2-aminoethanol 7.6 mmol (Synthesis Example 5), 2-mercaptophenol 7.6 mmol (Synthesis Example 6) and 2-mercaptobenzoic acid 7.6 mmol (Synthesis Example 7), respectively, as an amphiphilic ligand instead of 6-mercaptohexanoic acid.

SYNTHESIS EXAMPLE 8

Synthesis ZnMgO Nano Particle Having Amphiphilic Ligand

ZnMgO nano particles in which amphiphilic ligand is bound to the surface thereof were synthesized using the same materials and repeating the same procedures as Example 1, except changing the concentration of zinc precursor, zinc acetate dehydrate to 1.31 g.

COMPARATIVE SYNTHESIS EXAMPLE 1

Synthesis ZnMgO Nano Particle without Ligand

Zinc acetate (0.93 g), magnesium acetate tetrahydrate (0.16 g) and DMSO (50 mL) were added into a 2-neck reaction flask, and then the solution was stirred until the solution was transparent. TMAH dissolved in EtOH was added drop wisely to the solution and the mixtures was reacted for 4 hours with stirring to obtain ZnMgO without a ligand.

COMPARATIVE SYNTHESIS EXAMPLE 2

Synthesis ZnMgO Nano Particle Having Hydrophobic Ligand

Zinc acetate (0.93 g), magnesium acetate tetrahydrate (0.16 g) and DMSO (50 mL) were added into a 2-neck reaction flask, and then the solution was stirred until the solution was transparent. TMAH dissolved in EtOH was added drop wisely to the solution and the mixtures was reacted for 4 hours with stirring to obtain ZnMgO without a ligand. A hydrophobic ligand, 1-dodecanethiol (≥98%, 7.6 mmol) was injected into the reaction flask and then mixture was reacted overnight with stirring. The reaction solution was precipitated in EtOH, and the solvent was removed with centrifugation. The obtained particles were re-dispersed in a small amount of toluene and re-precipitated in EtOH. Steps of EtOH precipitation, solvent removal, re-dispersion and re-precipitation were repeated 2-3 times, and then finally re-dispersed in anhydrous EtOH to give ZnMgO nano particles in which a 1-dodecanethiol ligand is bound to the surface thereof.

EXPERIMENTAL EXAMPLE 1

Measurement of Physical Property of ZnMgO without Ligand

Figure 7:
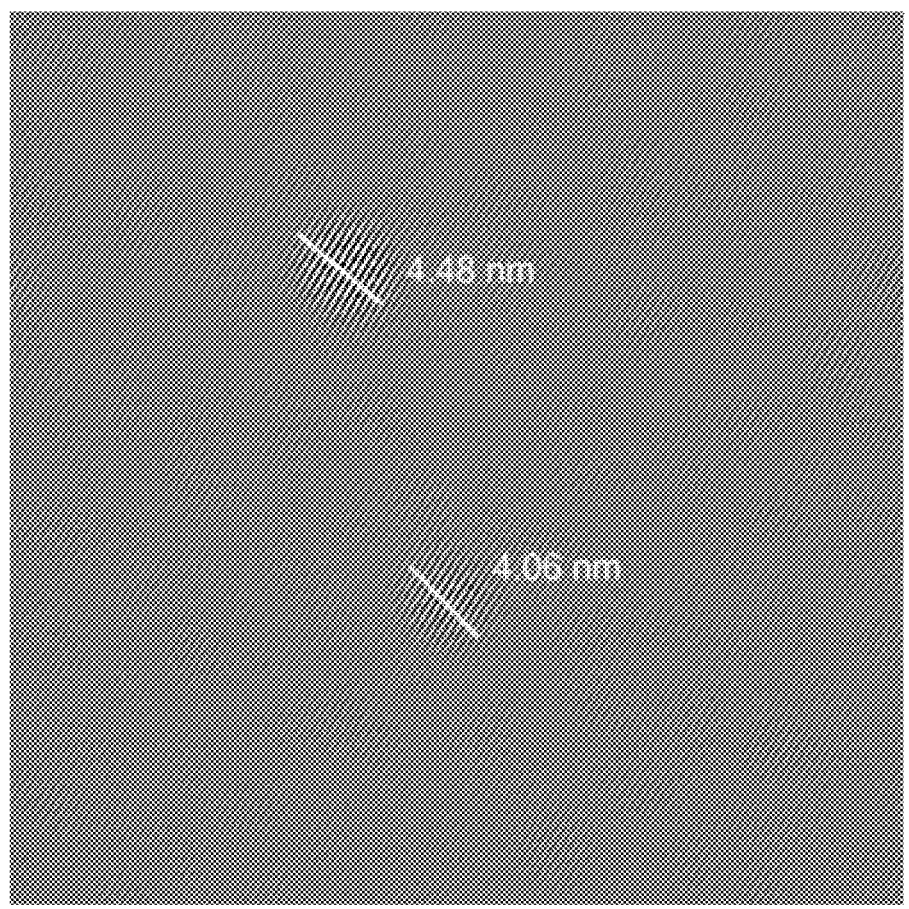
FIG. 7 is a TEM image illustrating a thin film made of metal oxide nano particles in which a ligand is not bound to the surface thereof.
Figure 8:
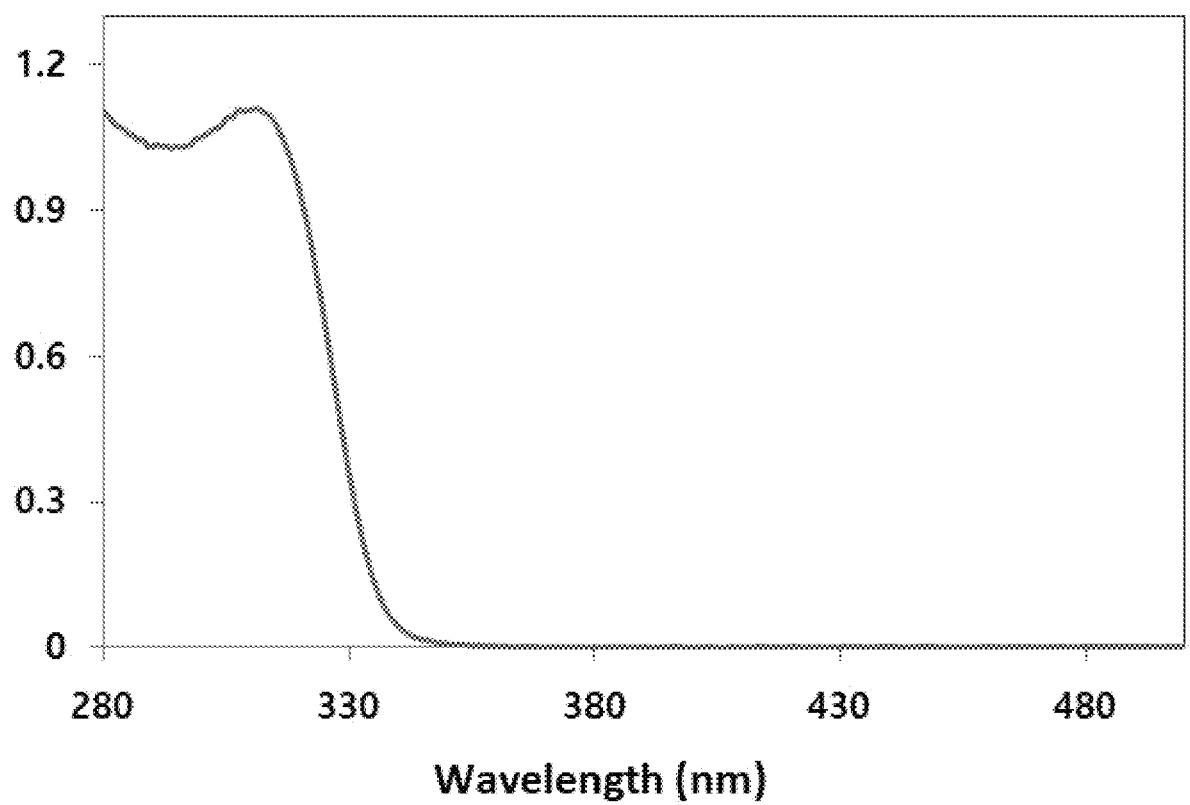
FIG. 8 is a graph illustrating absorbance spectrum of a thin film made of metal oxide nano particles in which a ligand is not bound to the surface thereof.

A solution (0.3 mL) of ZnMgO without ligand in Comparative Synthesis Example 1 dispersed in ethanol was added drop wisely onto a silicon wafer substrate (4 cm×4 cm) and then spin-coated at 3000 rpm for 45 seconds to form a ZnMgO thin film. We measured the surface state of the ZnMgO thin film using TEM. As illustrated in FIG. 7, as metal oxide nano particles were not formed on a part of the surface of ZnMgO film where ligand is not bound to the surface, and thus voids were generated. Also, we measured absorption spectrum for the thin film made of ZnMgO without ligand. As illustrated in FIG. 8, ZnMgO in which no ligand is bound to the surface thereof showed a maximum absorption wavelength at about 310 nm.

EXPERIMENTAL EXAMPLE 2

Measurement ZnMgO Film Morphology

Figure 9:
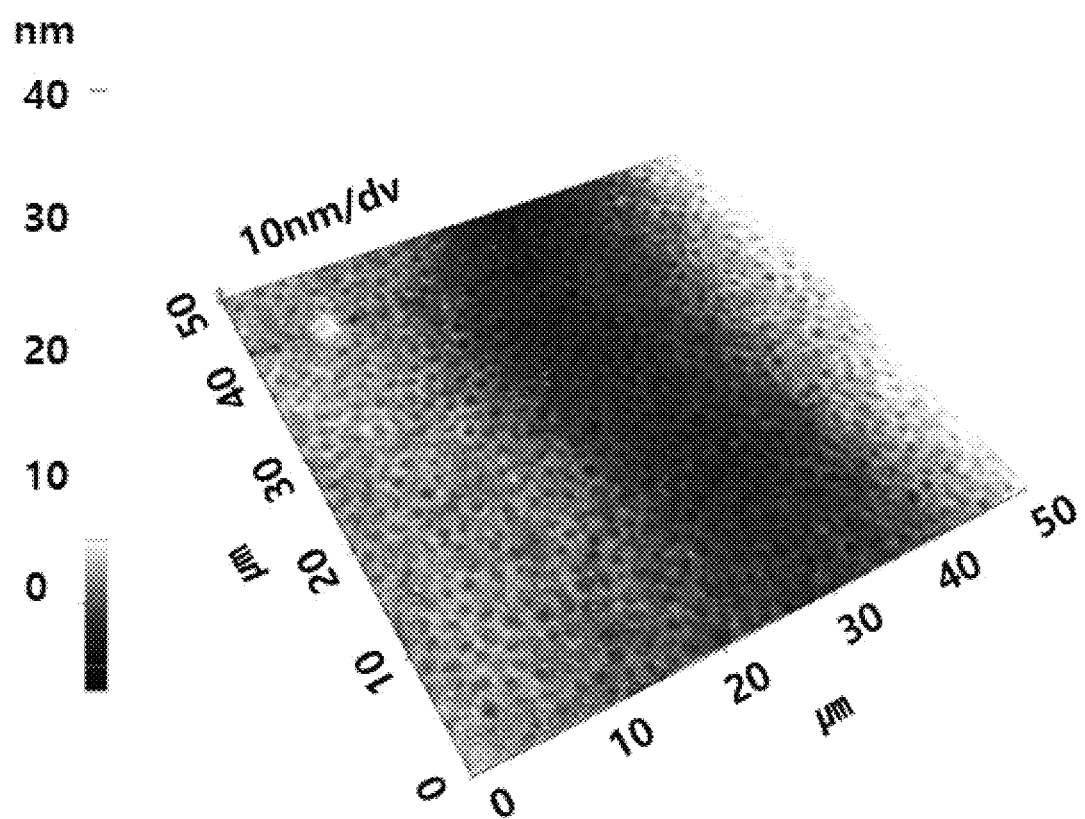
FIG. 9 is an ATM image illustrating a thin film made of metal oxide nano particles in which a ligand is not bound to the surface thereof.
Figure 10:
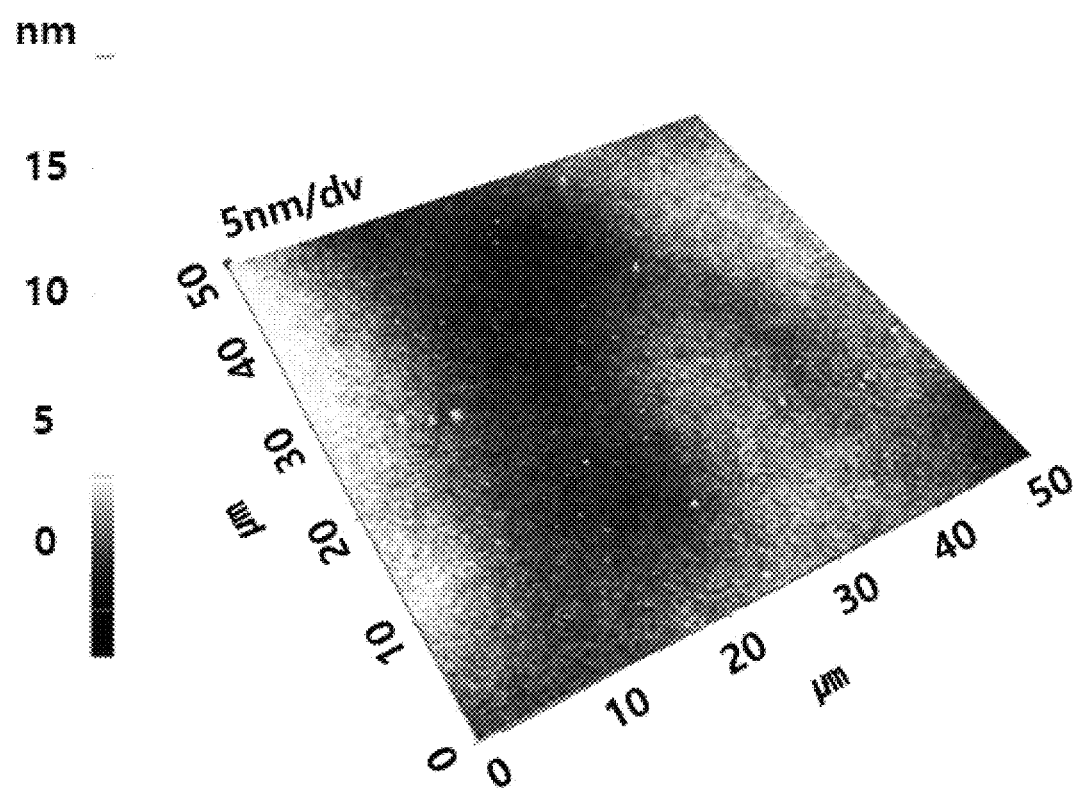
FIG. 10 is an ATM image illustrating a thin film made of metal oxide nano particles in which a hydrophobic ligand is bound to the surface thereof.
Figure 11:
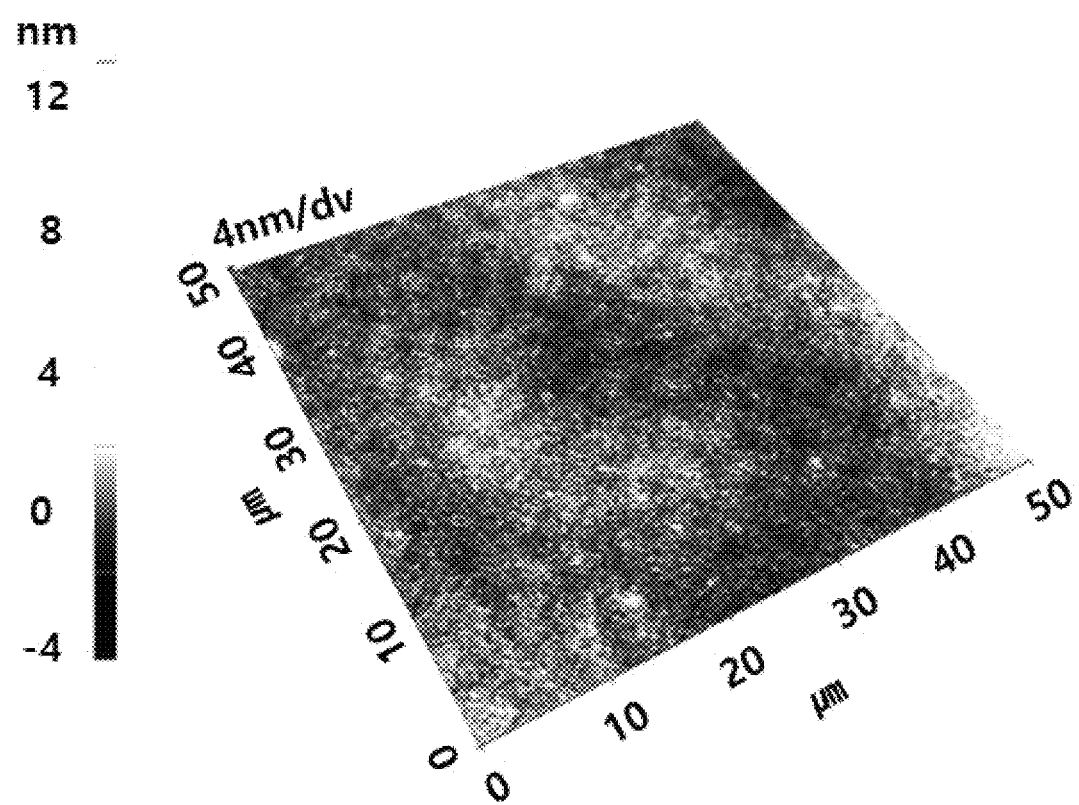
FIG. 11 is an ATM image illustrating a thin film made of metal oxide nano particles in which an amphiphilic ligand is bound to the surface thereof.

A thin film made of ZnMgO in which 11-mercaptoundecanic acid ligand in Synthesis Example 3 and a thin film made of ZnMgO in which 1-dodecanethiol ligand in Comparative Synthesis Example 2 were fabricated using the same procedure as Experimental Example 1. We measured the thickness of three thin films (ZnMgO without ligand, ZnMgO with 11-mercaptoundecanic acid ligand and ZnMgO with 1-dodecanethiol ligand) using TEM and surface morphology for three thin films using AFM. Measurement results are shown in Table 1 below and FIGS. 9 to 11. We certified that the thin film made of ZnMgO in which amphiphilic ligand, 11-mercaptoundecanic acid ligand, is bound to the surface thereof has significantly improved surface morphology.

EXAMPLE 1

(Ex. 1): Fabrication of LED

A LED in which ZnMgO nano particles in which 6-mercaptohexanoic acid was bound to the surface thereof in Synthesis Example 1 was introduced in the ETL was fabricated. An ITO (50 nm)-glass was patterned to have luminous area 3 mm×3 mm and washed. And an emissive layer and cathode were laminated as the following order:

a HIL (PEDOT:PSS, 0.3 mL drop at water-base, spin coating (5000 rpm) for 60 seconds and heating at 200° C. for 15 minutes, 40 nm); a HTL (TFB (in toluene) 0.3 mL drop, spin coating (6000 rpm) for 45 seconds and heating at 200° C. for 30 minutes, 20 nm); an EML (green QD InP/ZnSe/ZnS (in octane), 0.3 mL drop, spin coating (4000 rpm, 45 seconds), 20 nm); an ETL (ZnMgO in which 6-mercaptohexanoic acid ligand is bound (in ethanol), 0.3 mL drop, spin coating (3000 rpm, 45 seconds), 20 nm); a cathode (Al, deposition at a rate of 15 nm/S under $2.0 \times 10^{-6}$ torr, 80 nm).

And then, the ITO-glass substrate having the laminated emissive layer was transferred to a vacuum chamber, where a cathode (Al; 80 nm) was deposited (deposition rate 15 nm /second) under $10^{-6}$ Torr. After depositing the cathode, The LED was transferred from the vacuum chamber to a dry box for film formation, followed by encapsulation using UV-curable epoxy and moisture getter.

EXAMPLES 2-7

(Ex. 2-7): Fabrication of LED

An LED was fabricated using the same materials as Example 1, except using each of the ZnMgO nano particles to which 2-mercaptopropionic acid ligand is bound (Ex. 2), the ZnMgO nano particles to which 11-mercaptoundecanoic acid ligand is bound (Ex. 3), the ZnMgO nano particles to which 2-mercaptoethanol ligand is bound (Ex. 4), the ZnMgO nano particles to which 2-aminoethanol ligand is bound (Ex. 5), the ZnMgO nano particles to which 2-mercaptophenol ligand is bound (Ex. 6) and the ZnMgO nano particles to which 2-mercaptobenzoic acid ligand is bound (Ex. 7), respectively, in the ETL instead of the ZnMgO particles in which 6-mercaptohexanoic acid ligand is bound to the surface thereof.

COMPARATIVE EXAMPLES 1-2

(Ref 1-2): Fabrication of LED

An LED was fabricated using the same materials as Example 1, except using each of the ZnMgO nano particles without ligand (Ref. 1) and the ZnMgO nano particles to which 1-dodecanethiol ligand (Ref 2), respectively, in the ETL instead of the ZnMgO particles in which 6-mercaptohexanoic acid ligand is bound to the surface thereof.

TABLE 1

Surface Morphology of thin film made of metal oxide nano particle

| Sample | Surface Roughness (Rq, nm) |
| --- | --- |
| Thin film of ZnMgO without ligand | 2.6 |
| Thin film of ZnMgO with hydrophobic ligand | 1.4 |
| Thin film of ZnMgO with amphiphilic ligand | 0.9 |

EXPERIMENTAL EXAMPLE 3

Analysis of LED Structure

Figure 12:
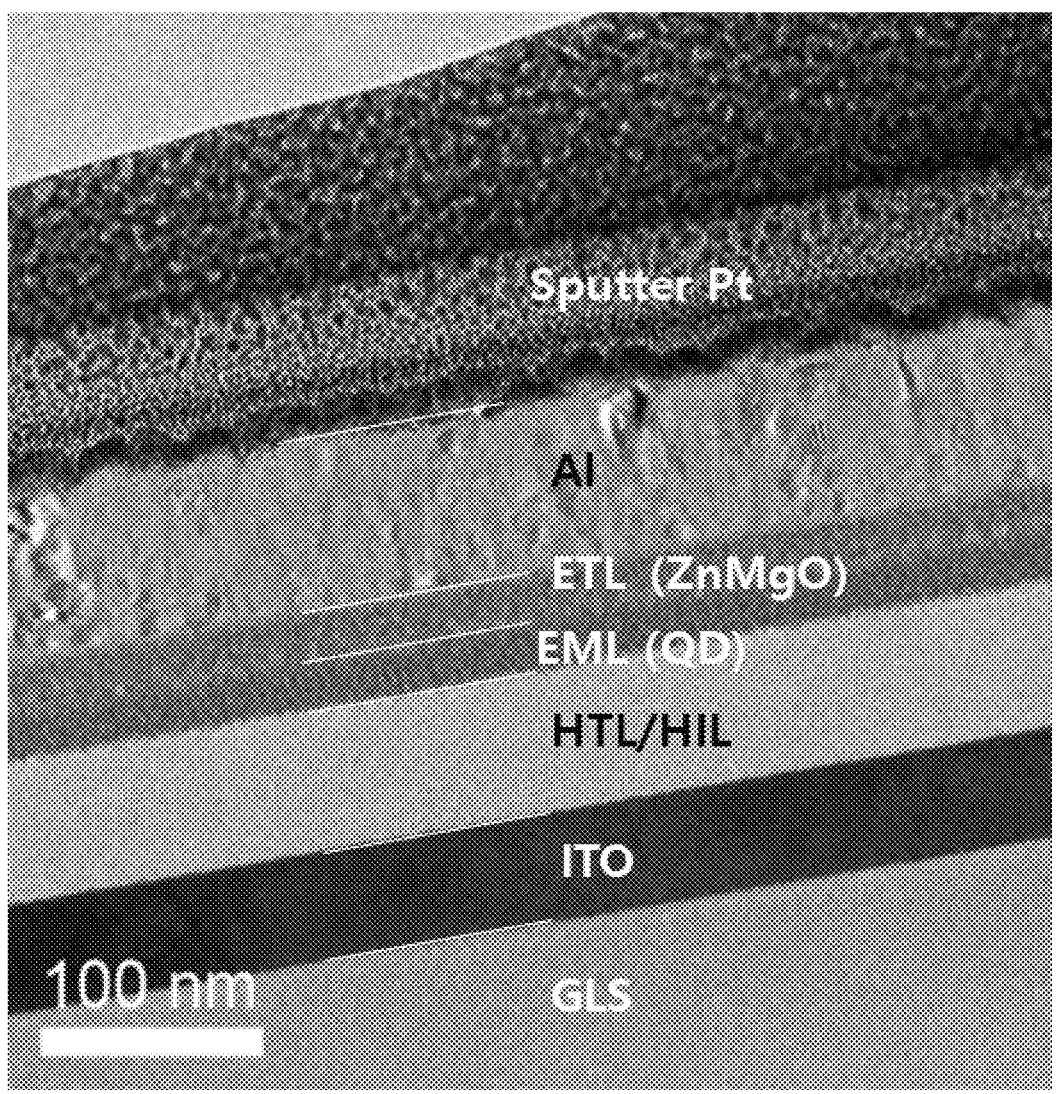
FIG. 12 is a TEM image illustrating a lamination structure of a light emitting diode in which metal oxide nano particles in which a ligand is not bound to the surface thereof are introduced in the ETL.
Figure 13:
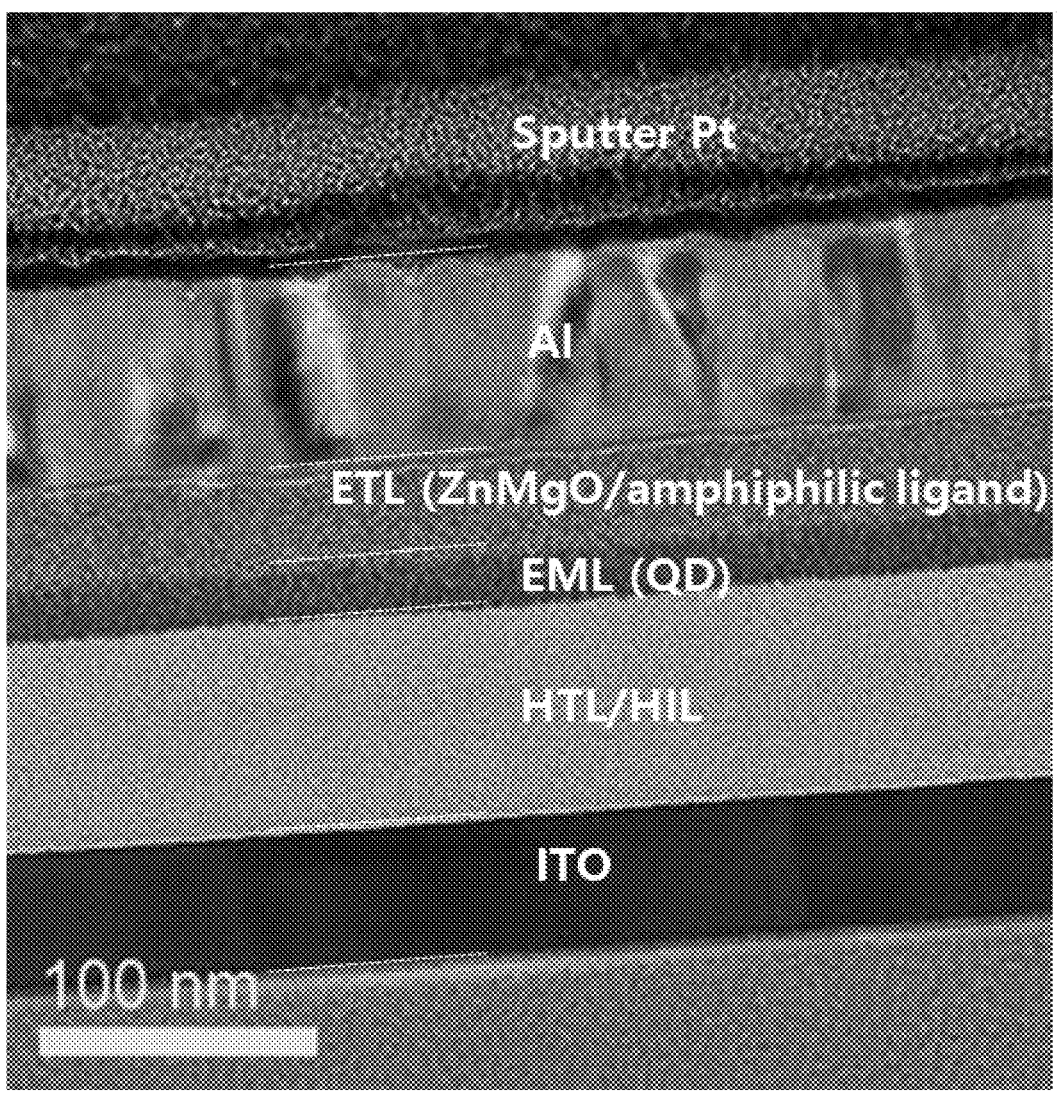
FIG. 13 is a TEM image illustrating a lamination structure of a light emitting diode in which metal oxide nano particles in which an amphiphilic ligand is bound to the surface thereof are introduced into the ETL.
Figure 14:
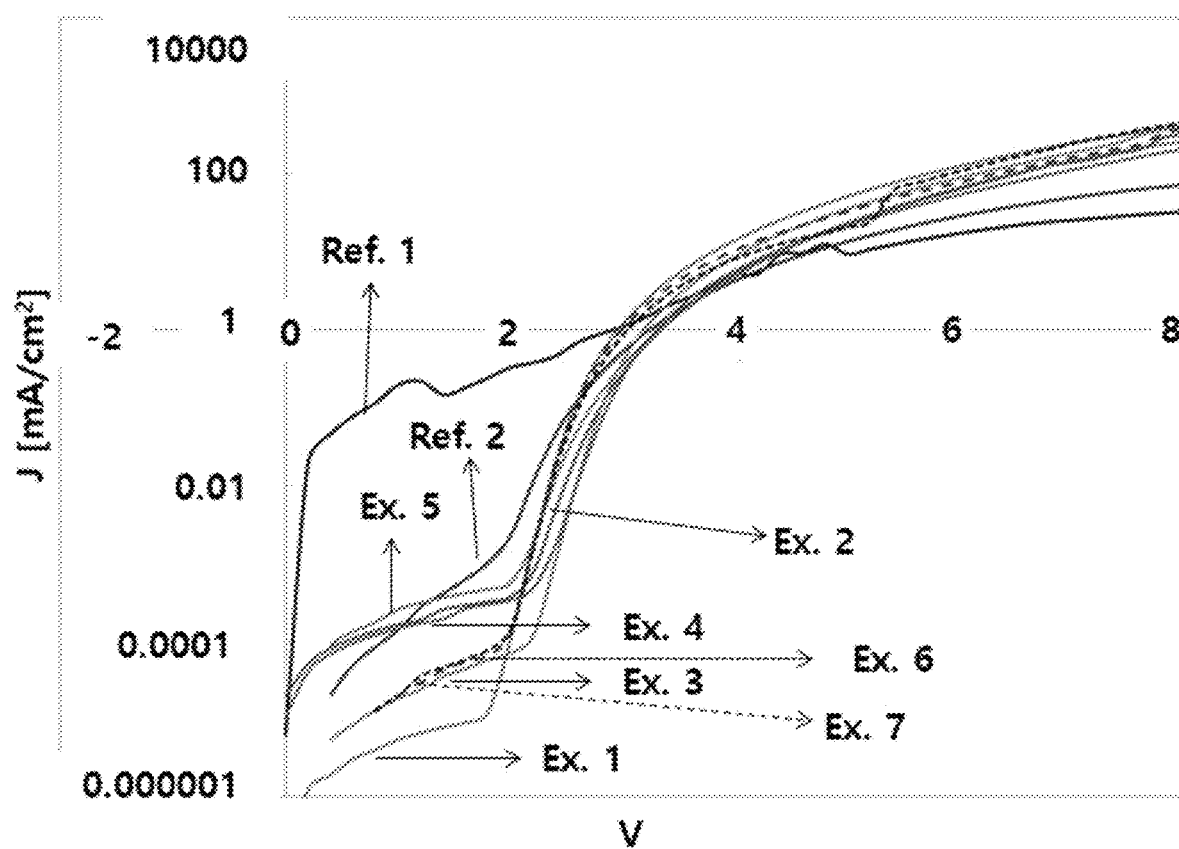
FIG. 14 is a graph illustrating voltage (V)—current density (J) relationship of a light emitting diode in accordance with Examples of the present disclosure.
Figure 15:
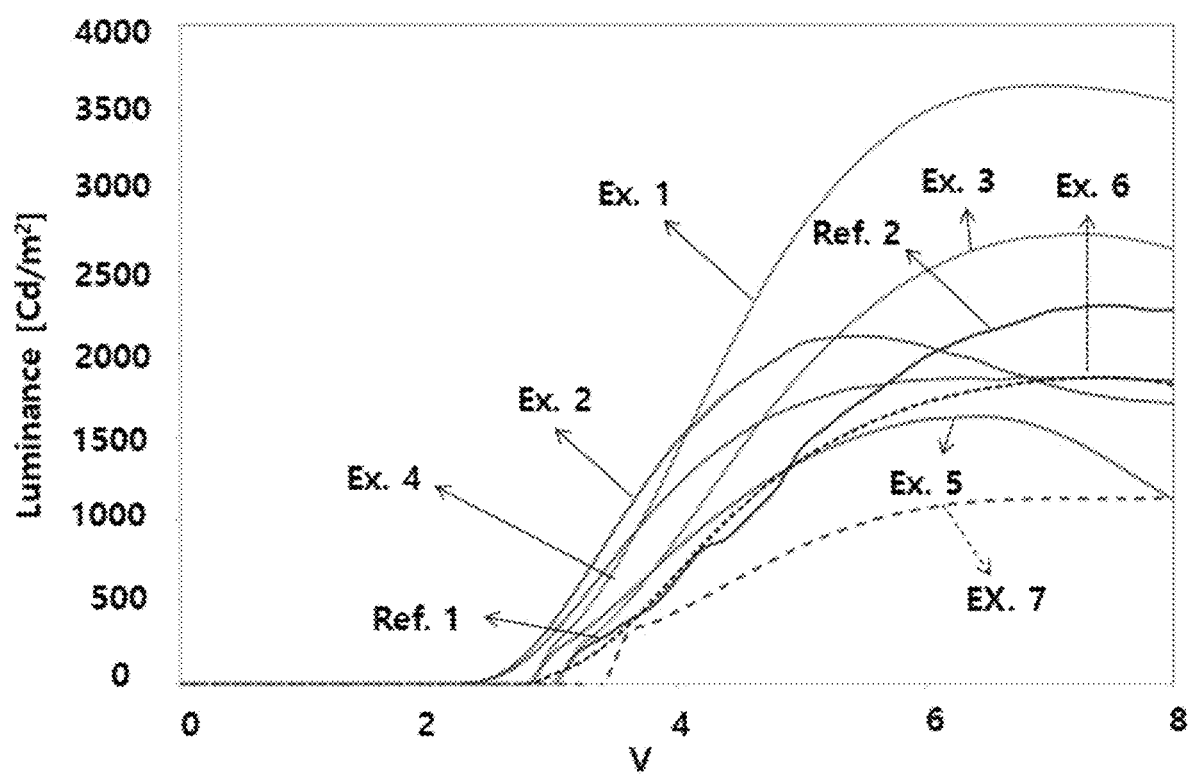
FIG. 15 is a graph illustrating voltage (V)—Luminance relationship of a light emitting diode in accordance with Examples of the present disclosure.
Figure 16:
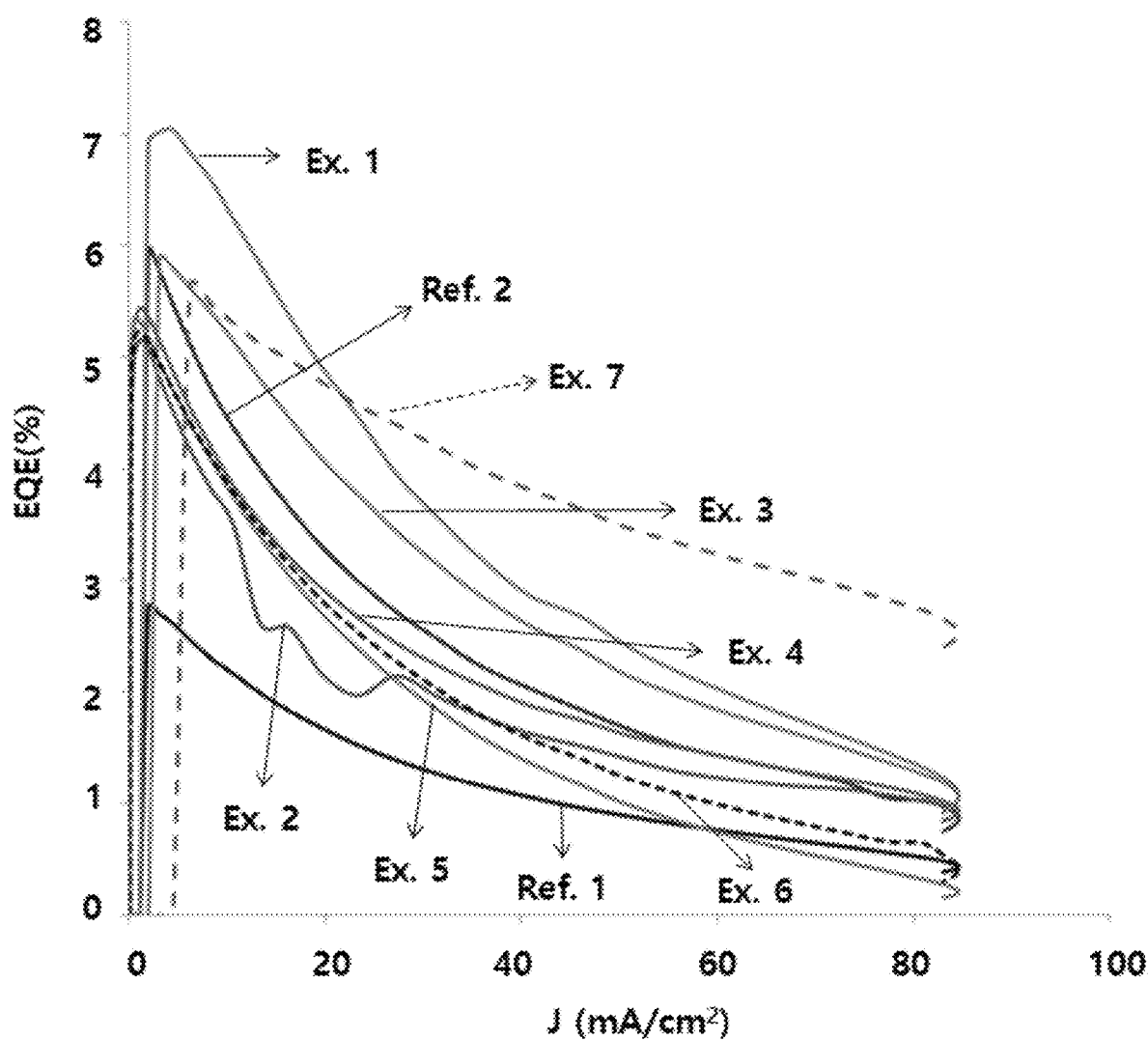
FIG. 16 is a graph illustrating current density (J)—EQE relationship of a light emitting diode in accordance with Examples of the present disclosure.
Figure 17:
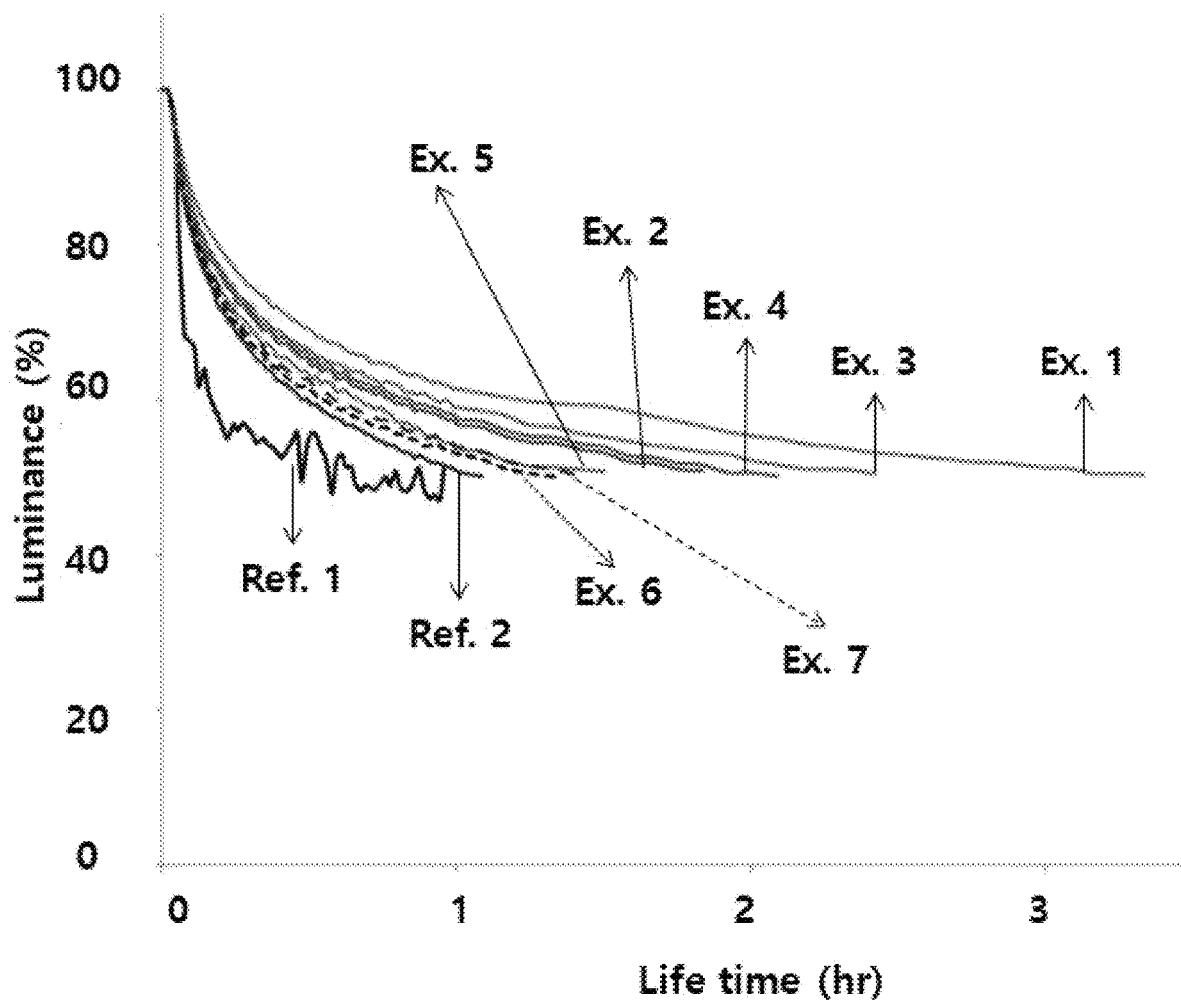
FIG. 17 is a graph illustrating life time—Luminance relationship of a light emitting diode in accordance with Examples of the present disclosure.

The cross-sectional structures of LEDs fabricated in Ref 1 and Ex. 1 were analyzed with TEM. Compared to the LED in which the ZnMgO nano particles without ligand are applied into the ETL of Ref 1 (FIG. 12), the LED in which the ZnMgO nano particles to which amphiphilic ligand, 6-mercaptohexanoic acid ligand is bound are applied into the ETL (FIG. 13) showed clearly divided interface between the EML and the ETL and formed flat interface.

EXPERIMENTAL EXAMPLE 4

Evaluation of Luminous Properties of LED

Each of the LED fabricated in Examples 1 to 7 and Refs. 1 to 2 was connected to an external power source and then luminous properties for all the diodes were evaluated using a constant current source (KEITHLEY) and a photometer PR650 at room temperature. In particular, voltage-current density, voltage-luminance, current density-external quantum efficiency (EQE) and time-luminance for the LEDs were measured. Also, driving voltage (V), (EQE; %), luminescence ($cd/m^2$), and luminous lifetime ($T_{50}$, hours) at a current density of 10 J ($mA/cm^2$) of the LEDs were measured. The results thereof are shown in the following Table 2 and FIGS. 14-17.

TABLE 2

Luminous Property of LED

| Sample | Ligand | V | EQE (%) | $cd/m^2$ | $T_{50}$ |
|---|---|---|---|---|---|
| Ref. 1 | — | 4.69 | 2.76 | 1806 | 0.9 |
| Ref. 2 | 1-dodecanethiol | 4.35 | 4.99 | 2035 | 1.0 |
| Ex. 1 | 6-mercaptohexanoic acid | 4.42 | 6.88 | 2837 | 3.3 |
| Ex. 2 | 2-mercaptopropionic acid | 4.19 | 5.36 | 2271 | 1.8 |
| Ex. 3 | 11-mercaptoundecanoic acid | 4.38 | 5.99 | 2679 | 2.5 |
| Ex. 4 | 2-mercaptoethanol | 4.07 | 5.19 | 2067 | 1.9 |
| Ex. 5 | 2-aminoethnaol | 4.20 | 5.27 | 2158 | 1.5 |
| Ex. 6 | 2-mercaptophenol | 5.40 | 5.26 | 2103 | 1.3 |
| Ex. 7 | 2-mercaptobenzoic acid | 5.60 | 5.45 | 2190 | 1.4 |

As indicated in Table 4 and FIGS. 14-17, compared to the LED of Ref. 1 which applies metal oxide nano particles without ligand into the ETL, the LEDs of Examples which applied metal oxide nano particles to which amphiphilic ligand is bound into the ETL lowered their driving voltages up to 13.2%, and improved their EQE, luminance and luminous lifetime up to 149.3%, 41.3% and 266.7%, respectively.

Also, compared to the LED of Ref. 2 which applied metal oxide nano particles to which the hydrophobic ligand is bound into the ETL, the LEDs of Examples which applies metal oxide nano particles to which amphiphilic ligand is bound to into the ETL lowered their driving voltages up to 6.4%, and improved their EQE, luminance and luminous lifetime up to 37.9%, 39.4% and 2.3 times, respectively.

Considering the results Ex. 1 to Ex. 3, when the hydrophobic group as an aliphatic chain has 5 or more carbons, the aggregations among metal oxide particles are reduced, thereby enhancing luminous efficiency and luminous lifetime of the LED. In addition, considering the results in Ex. 4 and Ex. 5, the thiol group as the anchor moiety is bound to the surface of the metal oxide particle strongly compared to the amino group, thereby improving the luminous efficiency of the LED. Moreover, the hydroxyl group and the carboxyl group as the hydrophilic group of the amphiphilic ligand have little influence on the luminous efficiency and luminous lifetime of the LEDs.

It will be apparent to those skilled in the art that various modifications and variations changes can be made in the present disclosure without departing from the scope of the invention. Thus, it is intended that the present disclosure cover the modifications and variations of the present disclosure provided they come within the scope of the appended claims.

What is claimed is:

1. A light emitting diode, comprising:
a first electrode;
a second electrode facing the first electrode;
an emitting material layer disposed between the first and second electrodes; and
an electron transfer layer disposed between the emitting material layer and one of the first and second electrodes acting as a cathode,
wherein the electron transfer layer comprises an inorganic material in which an amphiphilic ligand is bound to a surface of an inorganic nano particle,
wherein the amphiphilic ligand comprises
an anchor portion bound to the surface of the inorganic nano particle,
a first moiety bound to the anchor portion, and
a second moiety bound to the first moiety,
wherein one of the first and second moieties is a hydrophobic group and the other of the first and second moieties is a hydrophilic group, and
wherein the first moiety comprises a $C_3$-$C_{20}$ alicyclic ring, a $C_6$-$C_{24}$ aromatic ring, or a $C_3$-$C_{24}$ hetero aromatic ring.

2. The light emitting diode of claim 1, wherein the first moiety is the hydrophobic group and the second moiety is the hydrophilic group.

3. The light emitting diode of claim 2, wherein the second moiety comprises a hydroxyl group or a carboxyl group.

4. The light emitting diode of claim 1, wherein the anchor portion comprises a thiol group, a sulfide group or an amino group.

5. The light emitting diode of claim 1, wherein the inorganic nano particle comprises a metal oxide nano particle.

6. The light emitting diode of claim 5, wherein the metal oxide nano particle comprises an oxide nano particle of a metal component selected from the group consisting of zinc (Zn), calcium (Ca), magnesium (Mg), titanium (Ti), tin (Sn), tungsten (W), tantalum (Ta), hafnium (Hf), aluminum (Al), zirconium (Zr), barium (Ba) and combination thereof.

7. The light emitting diode of claim 1, wherein the electron transfer layer further comprises a metal component n-doped with the inorganic material.

8. The light emitting diode of claim 1, wherein the emitting material layer comprises quantum dots (QD) or quantum rods (QR).

9. A light emitting device, comprising
a substrate; and
the light emitting diode of claim 1 and disposed over the substrate.

10. The light emitting diode of claim 1, wherein the electron transfer layer is directly contacted to the emitting material layer.

11. A light emitting diode, comprising:
a first electrode;
a second electrode facing the first electrode;

an emitting material layer disposed between the first and second electrodes;

a first charge transfer layer disposed between the first electrode and the emitting material layer; and a second charge transfer layer disposed between the emitting material layer and the second electrode, wherein at least one of the first and second charge transfer layers comprises an inorganic material in which an amphiphilic ligand is bound to a surface of an inorganic nano particle, wherein the amphiphilic ligand comprises
  an anchor portion bound to the surface of the inorganic nano particle,
  a first moiety bound to the anchor portion, and
  a second moiety bound to the first moiety, wherein one of the first and second moieties is a hydrophobic group and the other of the first and second moieties is a hydrophilic group, and wherein the first moiety comprises a $C_3$-$C_{20}$ alicyclic ring, a $C_6$-$C_{24}$ aromatic ring or a $C_3$-$C_{24}$ hetero aromatic ring.

12. The light emitting diode of claim 11, wherein the first moiety is the hydrophobic group and the second moiety is the hydrophilic group.

13. The light emitting diode of claim 12, wherein the second moiety comprises a hydroxyl group or a carboxyl group.

14. The light emitting diode of claim 11, wherein the anchor portion comprises a thiol group, a sulfide group or an amino group.

15. The light emitting diode of claim 11, wherein the inorganic nano particle comprises a metal oxide nano particle.

16. The light emitting diode of claim 15, wherein the second charge transfer layer comprise the inorganic material, and wherein the inorganic nano particle comprise an oxide nano particle of a metal component selected from the group consisting of zinc (Zn), calcium (Ca), magnesium (Mg), titanium (Ti), tin (Sn), tungsten (W), tantalum (Ta), hafnium (Hf), aluminum (Al), zirconium (Zr), barium (Ba) and combination thereof.

17. The light emitting diode of claim 16, wherein the second charge transfer layer further comprises a component n-doped with the oxide nano particle of the metal component.

18. The light emitting diode of claim 11, wherein the first charge transfer layer comprises the inorganic material, and wherein the inorganic nano particle comprises an oxide nano particle of a metal component selected from the group consisting of zinc (Zn), calcium (Ca), magnesium (Mg), titanium (Ti), tin (Sn), tungsten (W), tantalum (Ta), hafnium (Hf), aluminum (Al), zirconium (Zr), barium (Ba) and combination thereof.

19. The light emitting diode of claim 18, wherein the first charge transfer layer further comprises a component p-doped with the oxide nano particle of the metal component.

20. The light emitting diode of claim 11, wherein both the first charge transfer layer and the second charge transfer layer are directly contacted to the emitting material layer.

* * * * *